US012087830B2

(12) United States Patent
Birner et al.

(10) Patent No.: US 12,087,830 B2
(45) Date of Patent: Sep. 10, 2024

(54) GROUP III NITRIDE DEVICE AND METHOD OF FABRICATING A GROUP III NITRIDE-BASED DEVICE

(71) Applicant: Infineon Technologies AG, Neubiberg (DE)

(72) Inventors: Albert Birner, Regensburg (DE); Helmut Brech, Lappersdorf (DE); John Twynam, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 456 days.

(21) Appl. No.: 17/237,178

(22) Filed: Apr. 22, 2021

(65) Prior Publication Data

US 2021/0336043 A1 Oct. 28, 2021

(30) Foreign Application Priority Data

Apr. 28, 2020 (EP) .................................... 20171930
Sep. 30, 2020 (EP) .................................... 20199461

(51) Int. Cl.
| | |
|---|---|
| *H01L 29/40* | (2006.01) |
| *H01L 21/765* | (2006.01) |
| *H01L 23/29* | (2006.01) |
| *H01L 23/31* | (2006.01) |
| *H01L 29/20* | (2006.01) |
| *H01L 29/205* | (2006.01) |
| *H01L 29/66* | (2006.01) |
| *H01L 29/778* | (2006.01) |

(52) U.S. Cl.
CPC .......... *H01L 29/402* (2013.01); *H01L 21/765* (2013.01); *H01L 23/291* (2013.01); *H01L 23/3171* (2013.01); *H01L 29/2003* (2013.01); *H01L 29/205* (2013.01); *H01L 29/401* (2013.01); *H01L 29/66462* (2013.01); *H01L 29/7786* (2013.01)

(58) Field of Classification Search
CPC . H01L 29/402; H01L 29/2003; H01L 29/205; H01L 29/401; H01L 29/66462; H01L 29/7786
See application file for complete search history.

(56) References Cited

U.S. PATENT DOCUMENTS

| | | | |
|---|---|---|---|
| 6,345,399 B1 | 2/2002 | Jamison et al. | |
| 2008/0272443 A1 | 11/2008 | Hoshi et al. | |
| 2013/0320350 A1 | 12/2013 | Häberlen et al. | |
| 2017/0133496 A1 | 5/2017 | Tsai et al. | |
| 2017/0365561 A1* | 12/2017 | Shiu .................. | G03F 7/094 |

(Continued)

FOREIGN PATENT DOCUMENTS

WO 2019066877 A1 4/2019

*Primary Examiner* — Nicholas J Tobergte
*Assistant Examiner* — Adin Hrnjic
(74) *Attorney, Agent, or Firm* — Murphy, Bilak & Homiller, PLLC

(57) ABSTRACT

In an embodiment, a Group III nitride-based transistor device includes a first passivation layer arranged on a first major surface of a Group III nitride-based layer, a second passivation layer arranged on the first passivation layer, a source ohmic contact, a drain ohmic contact and a gate positioned on the first major surface of a Group III nitride-based layer, and a field plate, the field plate being laterally arranged between and spaced apart from the gate and the drain ohmic contact.

8 Claims, 14 Drawing Sheets

(56) References Cited

U.S. PATENT DOCUMENTS

2019/0097001 A1    3/2019  Laroche et al.
2020/0066889 A1*   2/2020  Then .................... H01L 29/402
2020/0227544 A1*   7/2020  Then .................. H01L 29/7786

* cited by examiner

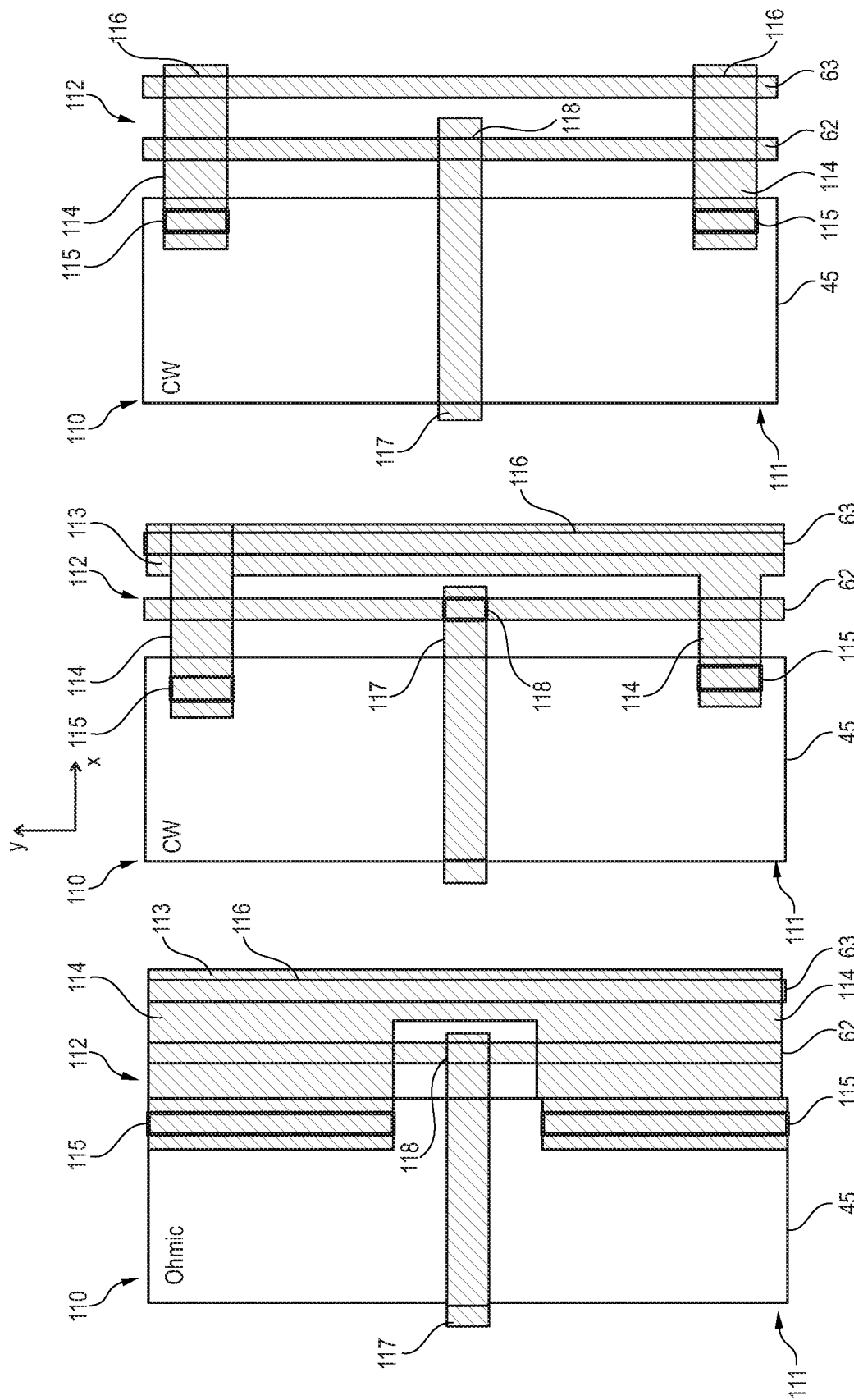

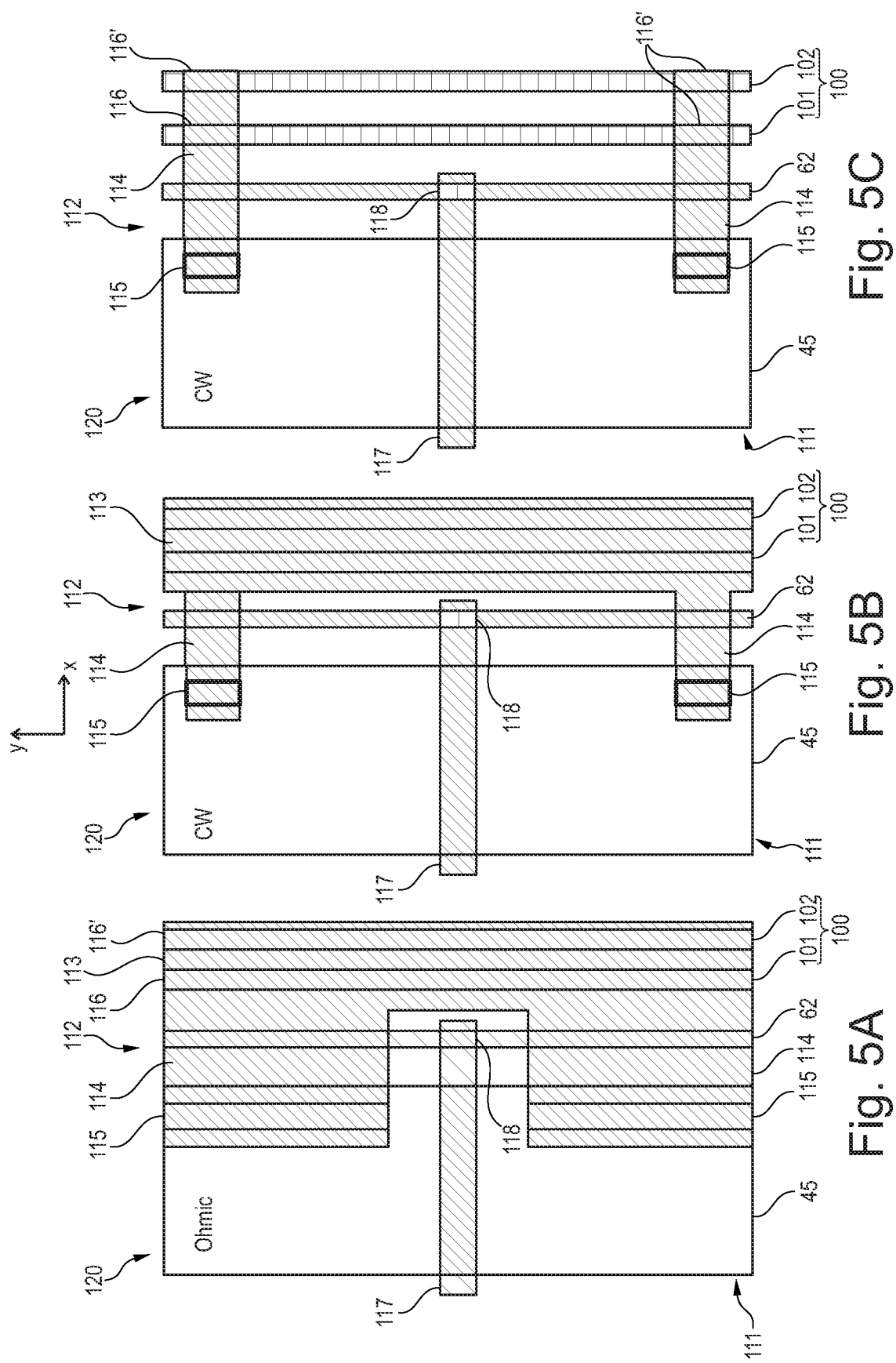

GROUP III NITRIDE DEVICE AND METHOD OF FABRICATING A GROUP III NITRIDE-BASED DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times. Further improvements to Group III nitride-based devices, are, however desirable.

SUMMARY

According to the invention, a method of fabricating a Group III nitride-based transistor comprises providing a substrate comprising a Group III nitride-based layer, a first passivation layer on the first major surface of the Group III nitride-based layer and a second passivation layer arranged on the first passivation layer, the second passivation layer having a different composition from the first passivation layer, forming a first mask layer on the second passivation layer, the first mask layer comprising a first insulating layer arranged on the second passivation layer and a first resist layer on the first insulating layer, forming a first opening for a gate electrode in the first mask layer, the first opening extending through the first resist layer and through the first insulating layer, forming a second opening for a field plate in the first mask layer, the second opening extending through the first resist layer and through the first insulating layer, removing the second passivation layer exposed by the first opening and forming a first via for the gate electrode, the first via having a base formed by the first passivation layer, removing the second passivation layer exposed by the second opening and forming a second via for a field plate, the second via having a base formed by the first passivation layer, removing the first resist layer, applying a second resist layer onto the first insulating layer that covers the second opening for the field plate and leaves the first opening for the gate electrode and a region of the first insulating layer adjacent the first opening uncovered, removing the first passivation layer exposed by first via and increasing the depth of the first via such that the first via has a base formed by the Group III nitride multi-layer structure, removing the second resist layer, and depositing an electrically conductive layer into the first via and the second via.

In some embodiments, the first resist layer is a photoresist layer and the second resist layer is a photoresist layer. In some embodiments, the electrically conductive layer is a tungsten layer.

In some embodiments, the method further comprises depositing the tungsten layer onto the second passivation layer laterally adjacent to the first via and the second via, and planarising to form a planarised surface comprising isolated areas of tungsten surrounded by the second passivation layer.

In some embodiments, the second resist layer leaves a portion of the first insulating layer that is arranged adjacent the first via exposed.

In some embodiments, the first insulating layer and the first photoresist are patterned using DUV (deep ultra violet) technology.

In some embodiments, the base of the first via has a width 30 nm to 500 nm, for example a width of around 250 nm or less or of 225 nm to 350 nm, for example around 250 nm and/or a minimum distance between the base of the first via and the second via is at the closest point 30 nm to 500 nm, or 225 nm to 350 nm, for example 250 nm or less.

In some embodiments, a base of the first via and a base of the second via each have a width of 50 nm to 400 nm, or 200 nm to 350 nm, for example around 250 nm and the distance between the first and second at the closest point is 100 nm to 400 nm, or 200 nm to 350 nm, for example around 250 nm.

In some embodiments, the first passivation layer comprises silicon nitride, the second passivation layer comprises silicon oxide and the first insulating layer comprises titanium nitride.

In some embodiments, the substrate further comprises a first ohmic contact and a second ohmic contact on the first major surface of the Group III nitride-based layer, the first passivation layer is located on the first major surface of the Group III nitride-based layer and extends between the first ohmic contact and the second ohmic contact and the second passivation layer is arranged on the first passivation layer and on the first ohmic contact and on the second ohmic contact.

In some embodiments, the substrate comprises a first passivation layer arranged on the first major surface. In some embodiments the method further comprises forming the first ohmic contact and the second ohmic contact on the first major surface of the Group III nitride-based layer that extend at least partially through the first passivation layer, covering the first ohmic contact and the second ohmic contact with a first sublayer of passivation material, planarising to form an intermediate planarized surface comprising a surface of the first ohmic contact, a surface of the second ohmic contact and the first sublayer, and forming a second sublayer of passivation material on the planarized surface and arranged on the first ohmic contact and the second ohmic contact, the first and second sublayers forming the second passivation layer.

In some embodiments, the method further comprises forming a structure for a second ohmic contact. The second ohmic contact may be a drain contact and the first ohmic contact may be a source contact. The structure for the first and second ohmic contacts may be formed using the same process, for example the same mask layers. The structure for the first and second ohmic contacts may be formed using the same process, for example the same mask layers, as for the gate and field plate(s).

In some embodiments, the method further comprises forming a third opening in the first mask layer, the third opening extending through the first photoresist layer and the first insulating layer and being positioned above the second ohmic contact, removing the second passivation layer exposed in the third opening and forming a third via having a base exposing a portion of the second ohmic contact, covering the third via with the second resist layer, and after removal of the second resist layer further depositing the tungsten into the third via, and planarising to form a planarised surface comprising isolated areas of tungsten positioned in the first, second and third vias, each isolated area of tungsten being surrounded by the second passivation layer.

In some embodiments, a second conductive layer of the metallization structure is fabricated.

In some embodiments, the method further comprises forming a second insulation layer on the second passivation layer and on the isolated areas of tungsten, forming a third insulating layer on the second insulation layer, the second and third insulation layers having differing compositions, structuring the third insulation layer to form a first trench positioned above the first via, the first trench having a base spaced apart from the first via by a portion of the third insulating layer and the second insulating layer, the first trench being laterally wider than the first via, forming a fourth via in the base of the first trench that exposes the tungsten in the first via by removing the third insulation layer and the second insulation layer, the fourth via being laterally smaller than the first trench and forming a second tungsten layer in the fourth via and in the first trench.

In some embodiments, trenches and vias for the gate and the field plate are formed in the second conductive level of metallization structure.

In some embodiments, the method further comprises structuring the third insulation layer to form a second trench above the second via and a third trench above the third via, the second trench having a base spaced apart from the second via by a portion of the third insulating layer and the second insulating layer, the second trench being laterally wider than the second via, the third trench having a base spaced apart from the third via by a portion of the third insulating layer and the second insulating layer, the third trench being laterally wider than the third via, forming a fifth via in the second trench that exposes the tungsten in the second via by removing the third insulation layer in the base of the second trench, forming a sixth via in the third trench that exposes the tungsten in the third via by removing the third insulation layer in the base of the third trench, and depositing the second tungsten layer into the second and third trenches and into the fifth and sixth vias.

In an embodiment, a Group III nitride-based transistor device comprises a source electrode, a drain electrode and a gate electrode positioned on a first major surface of a Group III nitride-based layer, wherein the gate electrode is laterally arranged between the source electrode and the drain electrode, and a field plate, the field plate being laterally arranged between and spaced apart from the gate electrode and the drain electrode. A base of the gate electrode and a base of the field plate each have a width of 50 nm to 400 nm, or 200 nm to 350 nm, for example around 250 nm and the distance between the gate electrode and the field plate at the closest point is 100 nm to 400 nm, or 200 nm to 350 nm, for example around 250 nm.

According to the invention, a Group III nitride-based transistor device is provided that comprises a first passivation layer arranged on a first major surface of a Group III nitride-based layer, a second passivation layer arranged on the first passivation layer, a source ohmic contact, a drain ohmic contact and a gate positioned on the first major surface of a Group III nitride-based layer, wherein the gate is laterally arranged between the source ohmic contact and the drain ohmic contact and comprises a gate via extending to an upper surface of the second passivation layer, a field plate, the field plate being laterally arranged between and spaced apart from the gate and the drain ohmic contact and extending to an upper surface of the second passivation layer, a first via extending from the source ohmic contact to an upper surface of the second passivation layer, a second via extending from the drain ohmic contact to the upper surface of the second passivation layer, wherein the second passivation layer covers peripheral regions of the source ohmic contact and the drain ohmic contact, and a first substantially planar insulating layer arranged on the upper surface of the second passivation layer and on peripheral regions of the gate electrode, the field plate, the first via and the second via.

In some embodiments, the source ohmic contact comprises a base portion having a conductive surface, the conductive surface comprising a peripheral portion and a central portion, the peripheral portion and the central portion being substantially coplanar and being of differing composition.

In some embodiments, the first via is positioned on the central portion of the conductive surface.

In some embodiments, the drain ohmic contact comprises a base portion having a conductive surface, the conductive surface comprising a peripheral portion and a central portion, the peripheral portion and the central portion being substantially coplanar and being of differing composition.

In some embodiments, the second via is positioned on the central portion of the conductive surface.

In some embodiments, the central portion comprises TiN and the peripheral portion comprises aluminium or an aluminium copper or a titanium aluminium alloy.

In some embodiments, a base of the field plate is in direct contact with the first passivation layer, a base of the gate via is in direct contact with the first major surface, the source ohmic contact extends at least partially through the first passivation layer, and the drain ohmic contact extends at least partially through the first passivation layer.

In some embodiments, the field plate extends substantially perpendicular to the first major surface and is electrically coupled to the source electrode by a lateral field plate redistribution structure that extends over and is spaced apart from the gate electrode.

In some embodiments, the source electrode, the gate electrode, the drain electrode and the field plate each have an elongate form and extend on the first major surface in a longitudinal direction substantially parallel to one another.

In some embodiments, the lateral field plate redistribution structure comprises a longitudinal section positioned above the field plate and extending substantially parallel to the longitudinal direction and a plurality of transverse sections spaced at intervals in the longitudinal direction, each transverse section extending over and being spaced apart from the gate electrode and being electrically coupled to the field plate by a field plate conductive via.

In some embodiments, the Group III nitride-based transistor device further comprises a lateral gate redistribution structure, the lateral gate redistribution structure comprising a plurality of transverse sections that extend substantially perpendicularly to the longitudinal direction, each transverse section being spaced apart from the gate electrode and electrically coupled to the gate electrode by a gate conductive via, the transverse section of the lateral gate redistribution structure being interleaved with the transverse sections of the lateral field plate redistribution structure.

In some embodiments, the source electrode is electrically coupled to the lateral field plate redistribution structure.

In some embodiments, the Group III nitride-based transistor device further comprises a source redistribution structure, wherein the source electrode is electrically coupled by one or more source conductive vias to the source redistribution structure and the source redistribution structure is integral with the transverse sections of the field plate redistribution structure.

In some embodiments, the source redistribution structure is formed of the source conductive vias and includes no lateral redistribution structure in the plane of the field plate redistribution structure.

In some embodiments, the source redistribution structure includes a longitudinal section extending in the longitudinal direction and arranged above and spaced apart from the source electrode. The longitudinal section of the source redistribution structure may be substantially coplanar with the longitudinal and transverse sections of the lateral field plate redistribution structure. The longitudinal section of the source redistribution structure may also be substantially coplanar with the lateral gate redistribution structure.

In some embodiments, the longitudinal section of the lateral field plate redistribution structure is laterally wider than the field plate.

In some embodiments, the field plate is split into two field plate sections that extend substantially parallel to one another and are laterally spaced apart from one another, the two field plate sections being laterally arranged between and spaced apart from the gate electrode and the drain electrode.

According to the invention, a Group III nitride-based transistor device is provided that comprises a source electrode, a drain electrode and a gate electrode positioned on a first major surface of a Group III nitride-based layer, wherein the gate electrode is laterally arranged between the source electrode and the drain electrode, a passivation layer arranged on the first major surface and a field plate coupled to the source electrode. The field plate has a lower surface arranged on the passivation layer and is laterally arranged between and laterally spaced apart from the gate electrode and the drain electrode. The source electrode, the gate electrode, the drain electrode and the field plate each have an elongate form and extend on the first major surface in a longitudinal direction substantially parallel to one another. The Group III nitride-based transistor device further comprises a conductive redistribution structure that is arranged above the source electrode, the gate electrode, the drain electrode and the field plate and comprises a lateral gate redistribution structure and a lateral field plate redistribution structure that are substantially coplanar at a position laterally between the source electrode and the drain electrode.

In this Group III nitride-based transistor device, the lateral gate redistribution structure and the lateral field plate redistribution structure are arranged in a plane above the plane of the gate electrode and the field plate. The lateral gate redistribution structure and the lateral field plate redistribution structure are positioned at least partially above the active region of the Group III nitride-based transistor device since they are arranged laterally between the source electrode and drain electrode.

In some embodiments, an upper surface of the field plate and an upper surface of the gate electrode are substantially coplanar.

In some embodiments, the gate electrode is electrically coupled to the lateral gate redistribution structure by one or more gate conductive vias.

In some embodiments, the one or more gate conductive vias are positioned laterally between the source electrode and the gate electrode in order to electrically connect the gate electrode to the lateral gate redistribution structure. The one or more gate conductive vias are arranged above the active region of the Group III nitride-based transistor device.

In some embodiments, the field plate is electrically coupled to the lateral field plate redistribution structure by one or more field plate conductive vias.

In some embodiments, the one or more field plate conductive vias are positioned laterally between the source electrode and the drain electrode in order to electrically connect field plate to the lateral field plate redistribution structure. The one or more field plate conductive vias are arranged above the active region of the Group III nitride-based transistor device.

In some embodiments, an upper surface of the source electrode and an upper surface of the drain electrode are substantially coplanar and arranged at a distance above the first major surface that is less than the distance between the upper surface of the gate electrode and the first major surface. This arrangement allows the source and drain electrode to be fabricated before the gate electrode and field plate.

In some embodiments, the source electrode is electrically coupled to the lateral field plate redistribution structure by one or more source conductive vias. The field plate is coupled to source potential in these embodiments.

In some embodiments, the lateral field plate redistribution structure extends over and is spaced apart from the gate electrode. This enables the lateral field plate redistribution structure to act as a shield for the gate electrode that is positioned underneath and spaced at a distance from the lateral field plate redistribution structure.

In some embodiments, the lateral field plate redistribution structure comprises a plurality of transverse sections spaced at intervals in the longitudinal direction, each transverse section extending over and being spaced apart from the gate electrode and being electrically coupled to the field plate by a field plate conductive via.

In some embodiments, the transverse sections together cover less than 50% or less than 20% of a length of the gate electrode. This arrangement may be described as a partially shielded structure.

In some embodiments, the transverse sections together cover at least 50% or at least 80% of a length of the gate electrode. This arrangement may be described as a shielded or fully shielded structure.

In some embodiments, the transverse sections of the lateral field plate structure are arranged above and spaced apart from the source electrode and the source electrode is electrically coupled by one or more source conductive vias to the transverse sections of the field plate redistribution structure. In this arrangement, the source conductive vias and the field plate conductive vias are arranged adjacent and spaced apart from opposing sides of the gate electrode.

In some embodiments, the lateral field plate redistribution structure further comprises a longitudinal section positioned above the field plate and extending substantially parallel to the longitudinal direction and to the field plate, wherein the longitudinal section is connected to the transverse sections. This arrangement may be used to increase the shielding of the gate electrode.

In some embodiments, the longitudinal section of the lateral field plate redistribution structure is laterally wider than the conductive vias and the field plate. This arrangement may be used to further increase the shielding of the gate electrode.

In some embodiments, the field plate is split into two field plate sections that extend substantially parallel to one another and are laterally spaced apart from one another, the two field plate sections being laterally arranged between and spaced apart from the gate electrode and the drain electrode.

In some embodiments, the lateral gate redistribution structure comprises a plurality of transverse sections spaced at intervals in the longitudinal direction, each transverse section being spaced apart from the gate electrode and electrically coupled to the gate electrode by a gate conductive via.

In some embodiments, the transverse sections of the lateral gate redistribution structure are interleaved with the transverse sections of the lateral field plate redistribution structure.

In some embodiments, an upper surface of the lateral gate redistribution structure is substantially coplanar with an upper surface of the lateral field plate redistribution structure.

In some embodiments, the transverse sections of the lateral gate redistribution structure extend over and are spaced apart from the source electrode.

In some embodiments, the lateral gate redistribution structure further comprises a longitudinal section that is positioned on an opposing side of the source electrode from the gate electrode and the transverse sections of the lateral gate redistribution structure are connected to the longitudinal section. In this arrangement, the lateral gate redistribution structure may also provide the gate pad with the lateral redistribution from the gate pad to the gate electrode being and substantially coplanar with the lateral field plate and drain redistribution structures. The vertical connection between the gat electrode and the lateral gate redistribution structure of the upper level is arranged directly above the gate electrode, i.e. by the one or more gate conductive vias extending between the gate electrode and the lateral gate redistribution structure, in the active area of the Group III nitride transistor device at a position laterally between the source and drain electrodes.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 4A to 4C illustrate respective plan views of a metallization structure for a Group III nitride-based transistor device according to embodiments.

FIGS. 5A to 5C illustrate respective plan views of a metallization structure for a Group III nitride-based transistor device according to embodiments.

DETAILED DESCRIPTION

Figure 1:
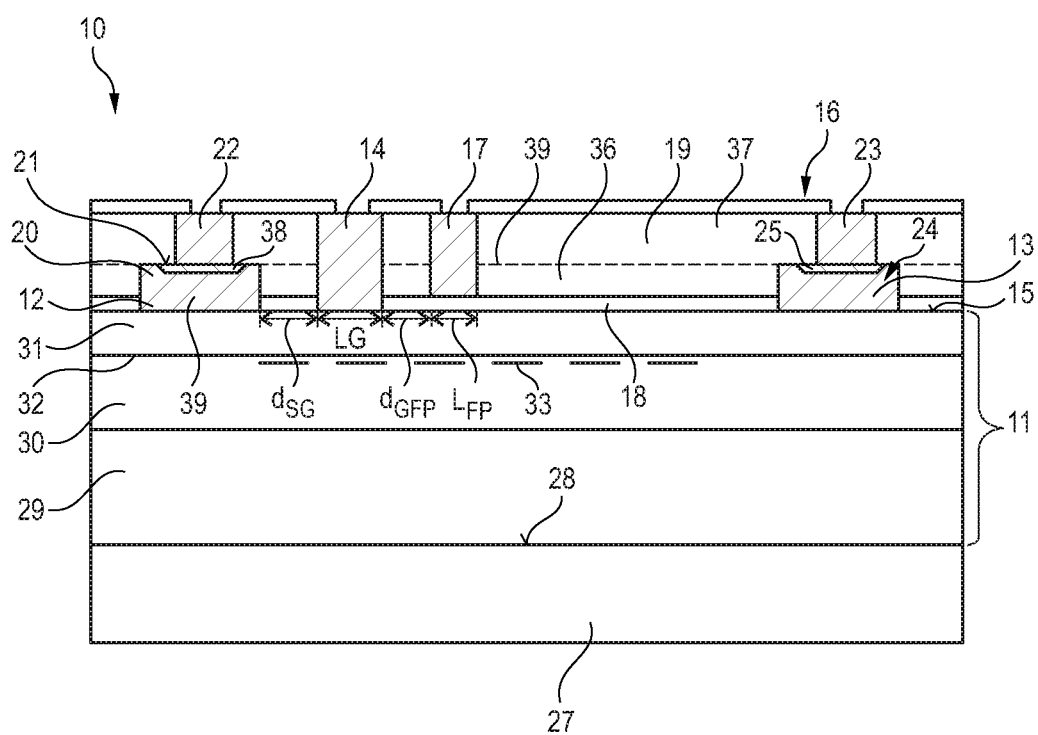
FIG. 1 illustrates a Group III nitride-based transistor device according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

Methods for fabricating an ohmic contact for Group III nitride-based devices, such as transistor devices, are used that enable the fabrication of a device with a short gate length Lg, for example Lg≤250 nm, and an optimized feed-back capacitance Cgd. Such short gate lengths are useful for radio-frequency application transistors requiring a high transition frequency fT in the range 50 GHz to 150 GHz. Such short gate lengths can be achieved using high precision patterning for which photolithography processes with thin photo resist flows are required.

However, the processing of such photoresists is highly sensitive to topography steps on a wafer, such as steps created by the Ohmic Metal of the source and drain contacts that is fabricated prior to the gate structure.

This disclosure makes use of an ohmic metallization concept which leaves no topography steps such as vertical steps due to RIE (Reactive Ion Etching) patterning of the Ohmic metal stack for the source and drain contacts so that photolithography can be applied to form shorter gate lengths and to position the gate more closely to the source contact to reduce $R_{DSON}$. The methods can be carried out using the process capabilities of a 200 mm CMOS production line and, therefore, cost effectively on wafers having a diameter of at least 200 mm.

According to the present disclosure, an Ohmic contact-first approach is used to fabricate a Group III nitride-based device, in particular a transistor device such as a HEMT (High Electron Mobility Transistor). In an embodiment, the method is carried out on a wafer, which may have a diameter of 6 inches or more, and includes planarizing the Ohmic metal before the fabrication of the gate structure. The ohmic metal may be formed by opening a window in the Group III nitride passivation, depositing an Ohmic metal stack, structuring the Ohmic metal stack and applying the Ohmic metal anneal step to alloy the ohmic metal. The ohmic metal can be planarized by depositing a CMP (Chemical Mechanical Polishing) stop layer on the frontside of the wafer, using chemical mechanical polishing on the structured Ohmic metal to produce a planarized surface and afterwards stripping the remaining parts of the stop layer.

The planarized surface is used for the further processing of the device, for example to form the gate using photolithography without underlying topography affecting the accuracy of the photolithographic process. Advantages of this approach include enabling of a low gate to source distance to enhance device performance and improving the critical dimension control of the gate process to enhance manufacturability and device performance.

FIG. 1 illustrates a schematic cross-sectional view of a Group III nitride-based device 10 according to an embodiment. The Group III nitride-based device 10 includes a Group III nitride-based layer 11, a first ohmic contact 12, a second ohmic contact 13 and a gate 14, which are arranged on a first major surface 15 of the Group III nitride-based layer 11. The Group III nitride-based device 10 may be a transistor device 16 such as a High Electron Mobility Transistor (HEMT). In embodiments in which the Group III nitride device 10 is a transistor device 16, the first ohmic contact 12 may provide a source contact and the second ohmic contact 13 may provide a drain contact. The gate 14 is arranged laterally between the source contact 12 and the drain contact 13. The Group III nitride-based device 10 also includes a field plate 17 that is positioned on the first major surface 15 and laterally between and spaced apart from the gate 14 and the drain contact 13.

The Group III nitride-based device 10 includes a first passivation layer 18 arranged on the first major surface 15 of the Group III nitride-based layer 11 and a second passivation layer 19 arranged on the first passivation layer 18.

The source contact 12, the gate 14 and the drain contact 15 extend through the first passivation layer 18, whereas the field plate 17 is arranged on the first passivation layer 18 and spaced apart from the underlying Group III nitride-based layer 11 by the first passivation layer 18. In some embodiments, the source contact 12, the gate 14 and the drain contact 15 are in direct contact with the Group III nitride-based layer 11.

Each of the first and second ohmic contacts 12, 13 comprises a base portion 20 having an upper conductive surface 21 that is positioned within the second passivation layer 19. Each of the ohmic contacts 12, 13 may have the same structure. The ohmic contacts 12, 13 may be fabricated at substantially the same time and are fabricated before the fabrication of the gate 14 and the field plate 17. The gate 14 and the field plate 17 are each formed of conductive material and extend through the entire thickness of the second passivation layer 19. The gate 14 includes a gate via and the field plate 17 includes a field plate via. The gate 14 may be a Schottky contact. In other embodiments, the transistor device 16 includes an insulated gate contact.

The first and second ohmic contacts 12, 13 each further comprise a conductive via 22, 23 that is positioned on the conductive surface 21 and that extends through the second passivation layer 19 to the upper surface. The conductive surface 21 has a peripheral portion 24 and central portion 25 that are substantially coplanar and are of differing composition. The conductive via 22, 23 is positioned on the central portion 25 and has a lateral extent which is less than the lateral extent of the base portion 20. In some embodiments, the lateral extent of the conductive via 22, 23 is less than the lateral extent of the central portion 25 of the conductive surface 21.

The Group III nitride-based layer 11 may include a multilayer Group III nitride structure positioned on a support substrate 27 which has a growth surface 28 which is capable of supporting the epitaxial growth of at least one Group III nitride layer. The support substrate 27 may be monocrystalline silicon substrate, for example a <111> or <110> silicon wafer or a monocrystalline sapphire substrate.

The multilayer Group III nitride structure 11 may include a Group III nitride buffer structure 29 arranged on the growth surface 28, a Group III nitride channel layer 30 arranged on the Group III nitride buffer structure 29 and a Group III nitride barrier layer 31 arranged on the Group III nitride channel layer 30. The Group III nitride barrier layer 31 has a different composition and bandgap to the Group III nitride channel layer 30 such that a heterojunction 32 is formed therebetween. For example, the Group III nitride channel layer 30 may comprise gallium nitride and the Group III nitride barrier layer 31 may comprise aluminium gallium nitride. The heterojunction 32 is capable supporting a two-dimensional charge gas which is indicated schematically in the in FIG. 1 by the dashed line 33. The first ohmic contact 12 and the second ohmic contact 13 form an ohmic contact with the two-dimensional charge gas 33.

A typical buffer structure 29 for a silicon substrate includes a AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer of AlGaN back barrier is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 2-25 nm. Depending on the desired breakdown voltage the superlattice may include between 20 and 100 pairs. Alternatively, an $Al_xGa_{(1-x)}N$ layer sequence as described above can be used in combination with the above mentioned superlattice.

As is indicated by the dotted line 35 in FIG. 1, the second passivation layer 19 includes two sublayers. The lower sublayer 36 is positioned on the Group III nitride-based barrier layer 31 and, during manufacture of the Group III nitride-based device 10, forms a planar surface with the conductive surface 21 of the base portion 20 of the first and second ohmic contacts 12, 13 before the deposition of the upper sublayer 37 onto the planar surface. The lower and upper sublayers 36, 37 may have the same composition, for example silicon oxide, and may be formed using a TEOS (Tetraethyl orthosilicate) process.

The first passivation layer 18 is positioned between the upper surface of the Group III nitride-based barrier layer 31 and has a different composition to the second passivation layer 19. For example, the first passivation layer 18 may be formed of silicon nitride.

In some embodiments, the passivation layer 18 is formed of a so called "high-k" dielectric, which has a higher dielectric constant compared to silicon dioxide, for example a hafnium- or zirconium-based dielectric materials such as hafnium silicate, hafnium dioxide, zirconium silicate and zirconium dioxide. This enables the thickness $d_{FP}$ of the passivation layer 18 between the lower surface of the field plate 17 and the first major surface 15 to be increased, leakage to be avoided and reliability to be improved for these thin passivation layers.

The formation of this planarised surface 35, represented by the dotted line 35, enables the subsequent layers built up upon it to be planar. This enables the gate 14 and field plate 17 to be formed using photolithographic techniques after the fabrication of the ohmic contacts 12,13, whereby the photoresist mask and deposition processes for fabricating at least a base portion of the gate 14 and field plate 17 can be carried out on this planarised surface 35.

This method enables the photoresist layer for the gate 14 and field plate 17 to be more accurately structured, since it is formed on a planar surface 35 and can be formed after the ohmic contacts 12, 13 are formed to the multilayer Group III structure 11, which typically involves higher processing temperatures. As a result of the more accurate structuring of the photoresist layer, the dimensions and position of the gate 14 and field plate 17 can be more accurately controlled. This also enables the distance $d_{SG}$ between the ohmic source contact 12 and the gate 14, as measured at the base of the ohmic contact 12 and gate 14, to be reduced and to be reliably produced at this reduced length. The gate to source distance $d_{SG}$ may be less than 0.5 µm, for example 250 nm or less in order to lower $R_{DSON}$ and enhance device performance. The more accurate structuring of the photoresist layer, the position of the field plate 17 with respect to the gate, $d_{GFP}$, can also be more reliably controlled and may also be less than 0.5 µm, for example 250 nm or less.

Additionally, the critical dimension control of the gate process is improved to enhance manufacturability and device performance. The gate length $L_G$ and/or the length of the field plate $L_{FP}$ may also be less than 0.5 µm, for example 250 nm or less. This high precision patterning of the gate electrode is enabled as the photoresist processes of the gate and field plate are not affected by topography steps created by the Ohmic metal contacts 12, 13 due to the formation of the planarized surface 35 after the formation of the base portion 20. Such topography steps would impair the local uniformity of the involved anti-reflection-coating and resist coating processes and would degrade the depth-of-focus of the lithographic exposure process. In effect the control of small dimension lithographic structures would be severely limited.

In some embodiments, a base of the gate electrode and a base of the field plate each have a width of 50 nm to 400 nm, or 200 nm to 350 nm, for example around 250 nm and the distance between the gate electrode and the field plate at the closest point is 100 nm to 400 nm, or 200 nm to 350 nm, for example around 250 nm.

In some embodiments, the upper conductive surface 21 of the ohmic contacts 12, 13 includes a single composition. The ohmic contacts 12, 13 may include a single composition or may include a stack of two or more layers of differing composition.

As discussed above, in some embodiments, the upper conductive surface 21 of the ohmic contacts 12, 13 includes two regions 24, 25 of differing composition that are coplanar. The central portion 25 and peripheral portion 24 may be provided as the upper surface of a base portion 20 that includes a well 38 comprising a metal or alloy of a first composition extending into a lower portion 39 comprising a metal or alloy of a second different composition. The upper surface of the well 38 provides the central portion 25 of the conductive surface 21 and the upper surface of the lower portion 39 provides the peripheral portion 24 of the conductive surface 21, so that the upper surface of the well 38 and the upper surface of the lower portion 39 are substantially coplanar.

In some embodiments, the well 38 and the central portion 25 of the conductive surface 21 comprise a conductive barrier material and the lower portion 39 and peripheral portion 24 comprise an ohmic contact material. An ohmic contact material is material which forms an ohmic contact to the Group III nitride material of the uppermost Group III nitride layer of the multilayer Group III nitride structure 11. In some embodiments, the conductive barrier material of the well 38 and the central portion 25 of the conductive surface 21 comprise titanium nitride and the lower portion 39 and peripheral portion 24 of the conductive surface 21 comprise aluminium or aluminium copper alloy or a titanium aluminium alloy.

The base portion 20 of the ohmic contacts 12, 13 and the lower portion of the gate via 14 may be referred to as electrodes, i.e. source electrode, gate electrode and drain electrode.

A method of fabricating a Group III nitride-based transistor device will now be described with reference to FIGS. 2A to 2J. The method may be used to fabricate the Group III nitride-based device illustrated in FIG. 1. In particular, the fabrication of a gate G and a field plate FP of a Group III nitride-based transistor device and subsequent layers of the conductive redistribution structure will be described.

A substrate 40 comprising a Group III nitride-based layer 41 is provided which includes a first passivation layer 42 arranged on a first major surface 43 of the Group III nitride-based layer 41 and a second passivation layer 44 arranged on the first passivation layer 42. The second passivation layer 44 is of a different composition from the first passivation layer 42. In some embodiments, the first passivation layer 42 is formed from a nitride, for example a silicon nitride and the second passivation layer 44 is formed from an oxide, for example a silicon oxide, for example a TEOS layer. The first passivation layer 42 is typically thinner than the second passivation layer 44.

In some embodiments, the passivation layer 42 is formed of a high-k dielectric, for example a hafnium- or zirconium-based dielectric materials such as hafnium silicate, hafnium dioxide, zirconium silicate and zirconium dioxide. This enables the thickness $d_{FP}$ of the passivation layer between the lower surface of the field plate 63 and the first major surface 43 to be increased.

The substrate 40 may include a foreign substrate formed of a material different to a Group III nitride. For example, the foreign substrate may be formed of silicon or sapphire. The Group III nitride-based layer 41 may have a multi-layer structure including a buffer layer arranged on the foreign substrate 40, a channel layer arranged on the buffer layer and a barrier layer arranged on the channel layer to form a heterojunction. The Group III nitride-based layer 41 may have a structure according to one of the embodiments described with reference to FIG. 1, for example.

A source contact 45 and a drain contact 46, which are typically ohmic contacts, have already been formed on the Group III nitride-based layer 41. The source contact 45 and drain contact 46 extend partially or entirely through the thickness of the first passivation layer 42. The source contact 45 and the drain contact 46 are covered by the second passivation layer 44.

A first mask layer 50 is formed on the second passivation layer 44. The first mask layer 50 includes a first insulating layer 51 arranged on the second passivation layer 44 and a first resist layer 52 arranged on the first insulating layer 51. In some embodiments, the first insulating layer 51 may be referred to as a hard mask and may include titanium nitride and the first resist layer 52 may be a photolithographically definable polymer layer, for example a photoresist, and may be referred to as soft mask. A first opening 53 for a gate electrode (G) and a second opening 54 for a field plate (FP) are formed in the first mask layer 50. The first and second openings 53, 54 extend through the first photoresist layer 52 and the first insulating layer 51.

In some embodiments one or more further openings 55 are formed above the source contact 45 and/or drain contact 46. In FIGS. 2A through 2J, the processing of an electrical connection to the ohmic drain contact 46 is illustrated since the connection structure to the source ohmic contact 45 is positioned in a plane of the transistor device which cannot be seen in the cross-sectional views of FIGS. 2A through 2J. The electrical connections for the source ohmic contact, drain ohmic contact and gate and a field plate may also be formed at substantially the same time using appropriately positioned openings in the first mask layer 50.

The source contact 45 and drain contact 46 may have an elongate strip-like structure with the length extending into the plane of the drawing. The gate and field plate may also have an elongate strip-like structure. Consequently, the openings 53, 54, 55 also have an elongate strip-like structure with the longest dimension, or length extending into the plane of the drawing.

The second passivation layer 44 is exposed in the base of the first, second and further openings 53, 54, 55 of the first mask layer 50 and the exposed region is then removed, for example by etching.

Figure 2A:
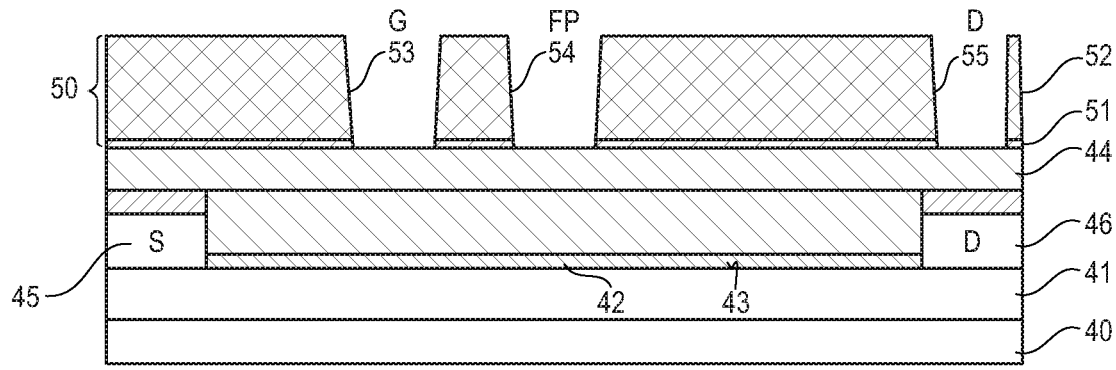
FIGS. 2A to 2J illustrate a method of fabricating a Group III nitride-based transistor device according to an embodiment.
Figure 2B:
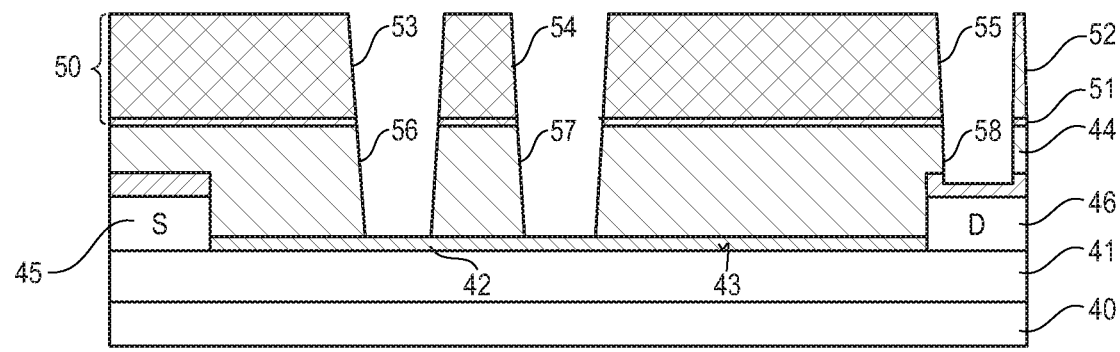

Referring to FIG. 2B, a first via 56 for the gate electrode is formed in the second passivation layer 44 which has a base formed by the first passivation layer 42. Similarly, the second passivation layer 44 which is exposed by the second opening 54 is removed to form a second via 57 for a field plate. The second via 57 also has a base formed by the first passivation layer 42. A further via 58 may be formed in the second passivation layer 44 at a position above the drain ohmic contact 46 (and not seen in FIGS. 2A through 2J, a further via for the source ohmic contact 45) which has a base formed by the respective ohmic contact 46, 45.

Figure 2C:
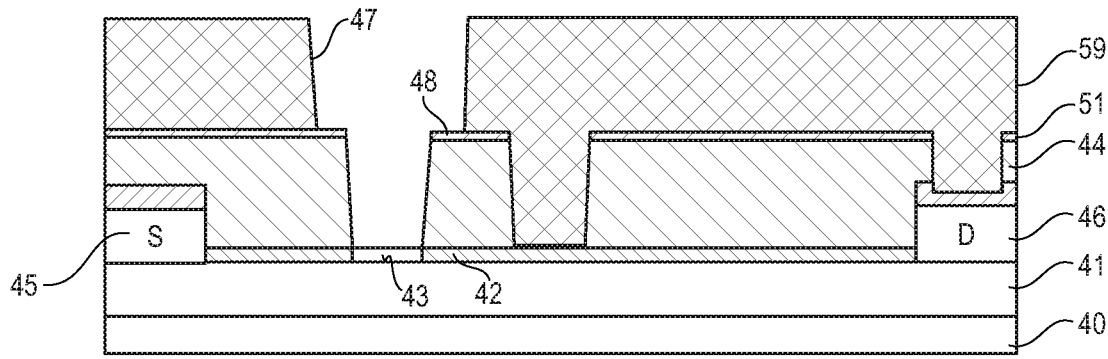

Referring to FIG. 2C, the first photoresist layer 52 is then removed and a second photoresist layer 59 is applied. The first insulating layer 51 of the first mask layer 50 is not removed such that the second photoresist layer 59 is applied onto the first insulating layer 51. The second photoresist layer 59 covers the second via 57 for the field plate and also the vias 58 for the drain and source ohmic contacts but leaves the first via 56 for the gate uncovered. Therefore, the second resist layer 59 includes an opening 47 positioned above the first via 56. A region 48 of the first insulating layer 51 that is positioned immediately adjacent the first via 56 also remains uncovered by the second photoresist layer 59. The opening 47 formed in the second photoresist layer 59 is, therefore, laterally wider than the lateral width of the first via 56.

The region of the first passivation layer 42 which is exposed at the base of the first via 56 is then removed using the exposed regions 48 of the first insulating layer 51 as a mask, as can be seen in FIG. 2C. The second resist layer 59 is then partially or completely removed.

Figure 2D:
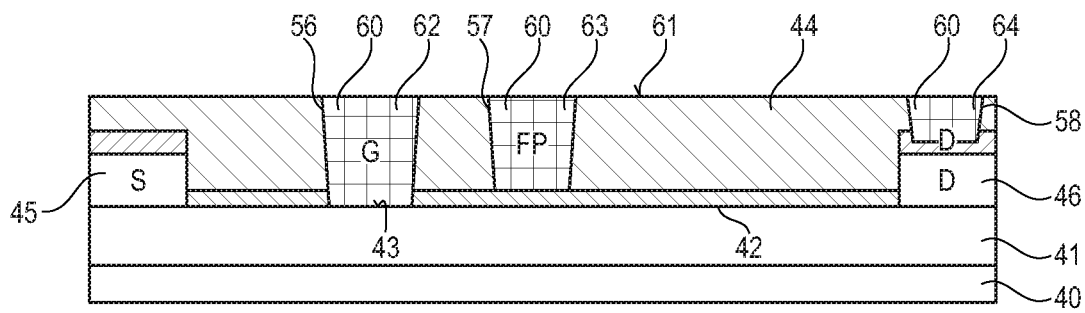

Referring to FIG. 2D, an electrically conductive material 60 is then inserted into the first via 56, the second via 57, the further via 58 and the unseen via positioned on top of the source ohmic contact.

In some embodiments, a planarisation process is then carried out to form a planarised surface 61 as illustrated in FIG. 2D. The conductive material 60 forms a conductive via 62 in the first via 56 which extends from the upper surface 61 of the planarised second passivation layer 44 through the entire thickness of the second passivation layer 44 and through at least part of the first passivation layer 42. In some embodiments, the conductive material 60 of the first conductive via 62 is in contact with the Group III nitride material of the body 41. The conductive material 60 forms a second conductive via 63 in the second via 57 and a third conductive via 64 in the further opening 58. The conductive material 60 may include tungsten. In other embodiments, the conductive material 60 may be copper. In other embodiments, the conductive material may comprise titanium nitride, tungsten nitride, tantalum nitride or aluminium. The conductive material 60 is formed on the first passivation layer 42 in the vias 57, 58 and on the surface 43 of the Group III nitride-based body 41 in the via 56.

The first conductive via 62 forms the gate and the second conductive via 63 forms the field plate of the transistor device. The first conductive via 62 and the gate and the second conductive via 63 and field plate 63 may have an elongate strip like structure with the length extending into the plane of the drawing. The gate and the field plate of the transistor device may therefore comprise tungsten or copper or titanium nitride, or tungsten nitride, or tantalum nitride or aluminium. The conductive material 60, the gate and the field plate may also include sublayers and have a multi-layer structure.

In some embodiments, the conductive material 60 may include one or more liner or barrier layers which are deposited on the side faces and optionally the base of the vias 56, 57, 58 formed in the second passivation layer 44. The liner may be formed on the first passivation layer 42 in the case of the vias 57, 58 and on the surface 43 of the Group III nitride-based body 41 in the via 56. A further conductive material, for example tungsten, may be inserted into the lined vias to fill the via and form a conductive via. The liner or barrier layer may include Ti/TiN.

The structure illustrated in FIGS. 2A and 2D each have a planarized upper surface 61 which is particularly suitable for using as a base, onto which further layers of a three-dimensional redistribution structure of the transistor device can be built up. In particular, the accurate placement of the vias 56 and 57 for the gate and field plate enables a short gate length, $L_G$, and small distance between the field plate and the gate, $L_{GFP}$, to be achieved. Fabrication of the subsequent layers of the metallization structure can also be carried out with greater lateral precision in order that the distances can be maintained.

Figure 2E:
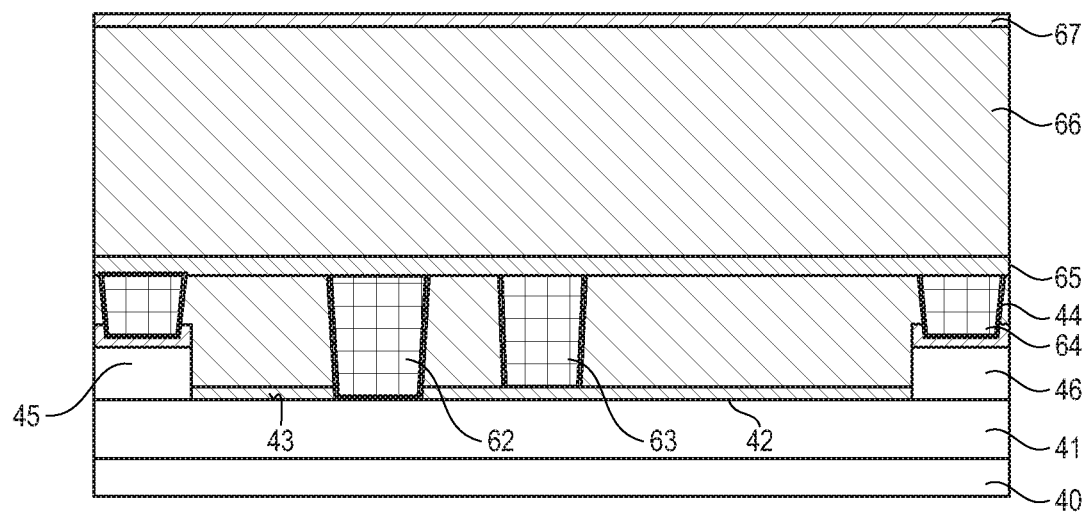

Referring to FIG. 2E, a third passivation layer 65 is deposited on the planarized surface followed by a fourth passivation layer 66 on the third passivation layer 65. The third passivation layer 65 may be thinner than the fourth passivation layer 66. The third passivation layer 65 may include nitride such as a silicon nitride and the fourth passivation layer may include an oxide such as a silicon oxide, for example TEOS. The first and third passivation layers 42, 65 may include substantially the same composition and the second and fourth passivation layers 44, 66 may include substantially the same composition.

A second mask 69 that includes two layers 67, 68 is formed on the fourth passivation layer 66. A second insulating layer 67, which may include titanium nitride, is formed on the fourth passivation layer 66 and a third resist layer 68 is formed on the second insulating layer 67 to form the second mask layer 69 having two layers of differing composition.

Figure 2F:
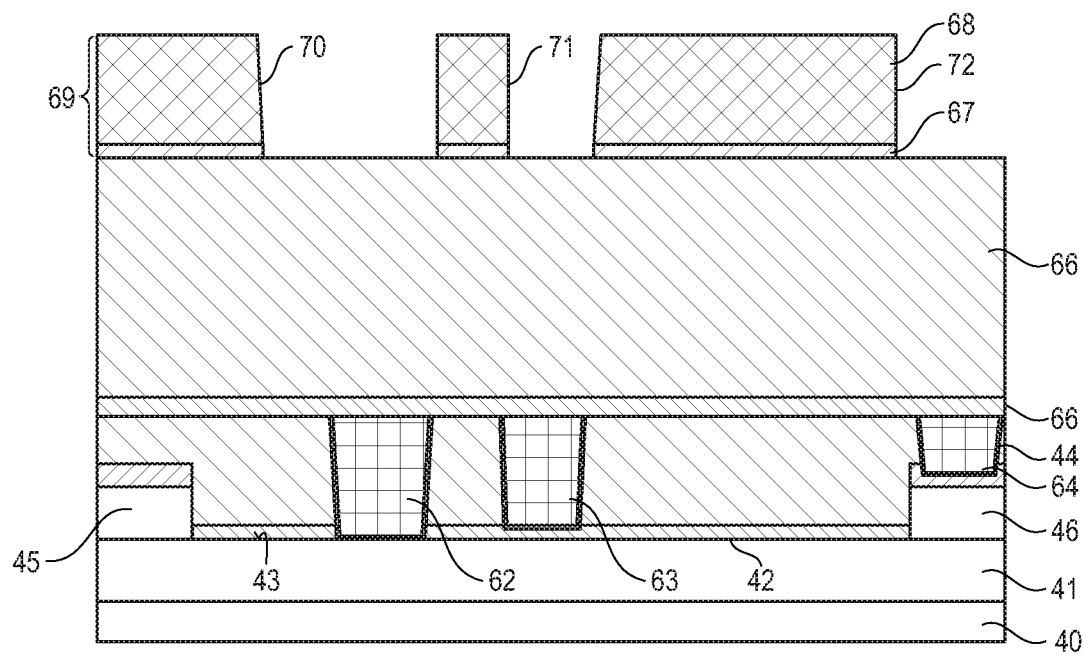

Referring to FIG. 2F, the second mask layer 69 is structured to form a fourth opening 70 positioned above the conductive via 62 for the gate and a fifth opening 71 positioned above the conductive via 63 for the field plate and a sixth opening 72 positioned above the conductive via 64 for the drain 46. A further opening may also be positioned above the source which cannot be seen in the cross-sectional view of FIG. 2F. The openings 70, 71 and 72 extend through the second insulating layer 67 and the third photoresist layer 68 such that a portion of the fourth passivation layer 66 is exposed in the base of the fourth, fifth and sixth openings 70, 71, 72.

A dual damascene process may be used to fabricate a conductive layer of the redistribution structure that vertically connects to the conductive vias 62, 63, 64 and that extends perpendicularly to the conductive vias 62, 63, 63 in lateral or horizontal directions. In order to form an opening with a vertical and lateral redistribution structure, a two-stage process may be used to form an opening in the third and fourth passivation layers 65, 66 with a suitable form. As with the first mask, the two layers 67, 68 of the second mask 69 may be used to form openings of two different lateral widths for removing portions of the fourth passivation layers 66 and for removing the third passivation layer 65.

The conductive layer of the redistribution structure that vertically connects to the conductive vias 62, 63, 64 and that extends perpendicularly to the conductive vias 62, 63, 63 in lateral or horizontal directions may be formed of the same material as the first conductive layer 60 and comprise one or more of tungsten, copper, titanium nitride, tungsten nitride, tantalum nitride or aluminium.

Figure 2G:
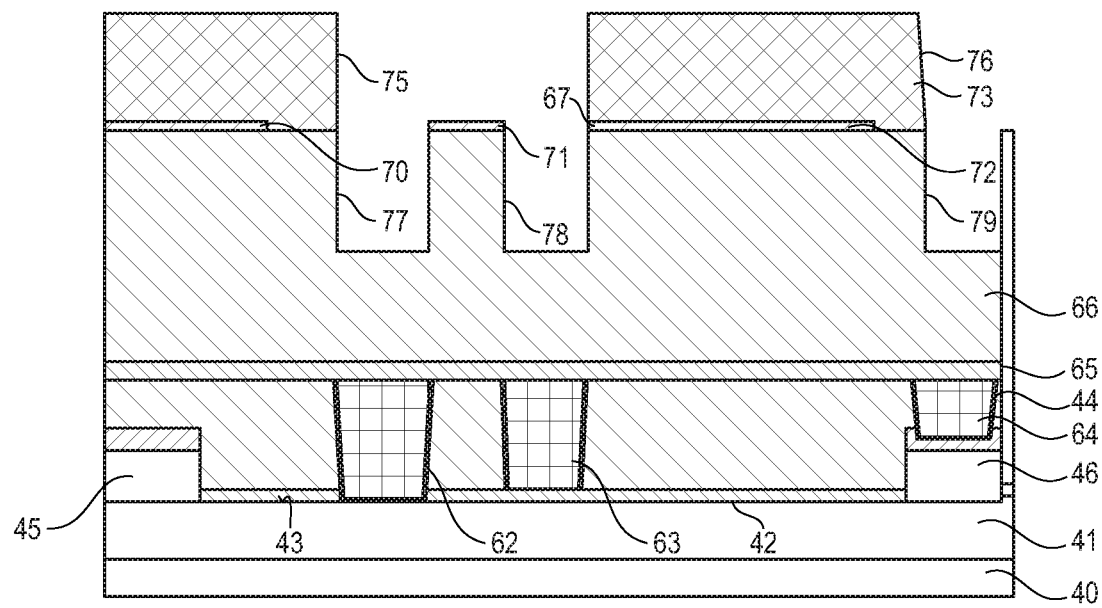

Referring to FIG. 2G, the third resist layer 68 is then removed and a fourth resist layer 73 applied which is positioned on the remaining portions of the second insulating layer 67 and on regions of the fourth passivation layer 66 positioned laterally adjacent the gate via 62 and drain via 64. The fourth resist layer 73 includes at least one opening 75 positioned above the gate via 62 and the field plate via 63 and at least one opening 76 positioned above the drain via 64. The openings 75, 76 are sized and positioned so as to form conductive vias through the thickness of the third and fourth passivation layers 65, 66 that are positioned at intervals along the elongate gate, field plate, drain and source respectively. The openings 75, 76 in the fourth resist layer 73 may be laterally smaller than the openings 70, 71, 72 in the remaining portion of the second insulating layer 67. For example, the openings 70, 71, 72 in the remaining portion of the second insulating layer 67 may be elongate and correspond to the elongate gate, field plate and drain.

The second passivation layer 66 that is exposed in the openings 75, 76 is also uncovered by the second insulating layer 67. These exposed regions are removed to form first indentations 77 positioned above the gate via 62, second indentations 78 positioned above the field plate via 63 and at least one third indentation 79 positioned above the drain via 64. The base of the indentations 77, 78, 79 is positioned within the fourth passivation layer 66.

Figure 2H:
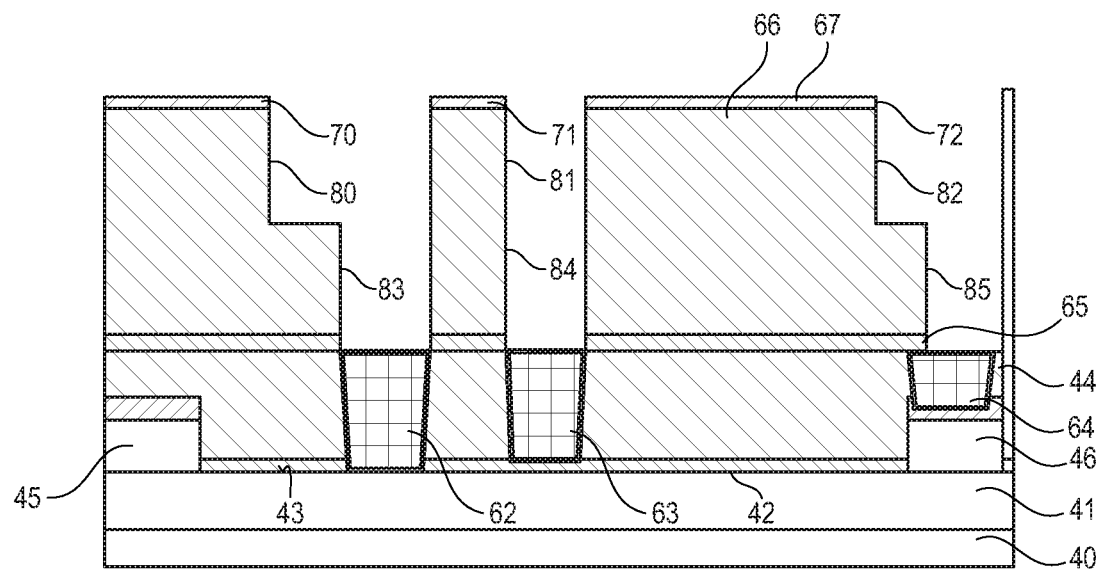

Referring to FIG. 2H, the fourth resist layer 73 is then removed and the remaining regions of the third insulating layer 67 are used as a mask, whereby remaining exposed portions of the fourth passivation layer 66 are removed. Due to the initial etching of the first indentations 77, a first trench 80 is formed which has an upper portion that is laterally wider than a lower portion. The lower portion has a lateral size and position corresponding to the indentations 77 such that a plurality of vias 83 are formed that extend from the upper portion through the fourth passivation layer 66 and third passivation layer 65 such that a plurality of areas of the elongate gate via 62 is exposed at the bottom of the first trench 80. The vias 83 may have a substantially round, square or hexagonal form in plan view and be spaced at intervals along the length of the elongate gate via 62.

The indentations 78 positioned above the field plate also extend through the entire thickness of the fourth passivation layer 66 and the third passivation layer 65 such that the base of a second trench 81 includes a plurality of vias 84 with a base formed by the conductive via 63 of the field plate. The vias 84 may have a substantially round, square or hexagonal form in plan view and be spaced at intervals along the length of the elongate field plate via 63.

A third trench 82 is formed that is positioned above the drain via 64 also has an elongate upper portion and a plurality of a lower portions forming vias 85 positioned at intervals along the length of the drain via 64 that extend through the entire thickness of the third and fourth passivation layers 65, 66 and expose the upper surface of the via 64 to the drain contact 46.

Figure 2I:
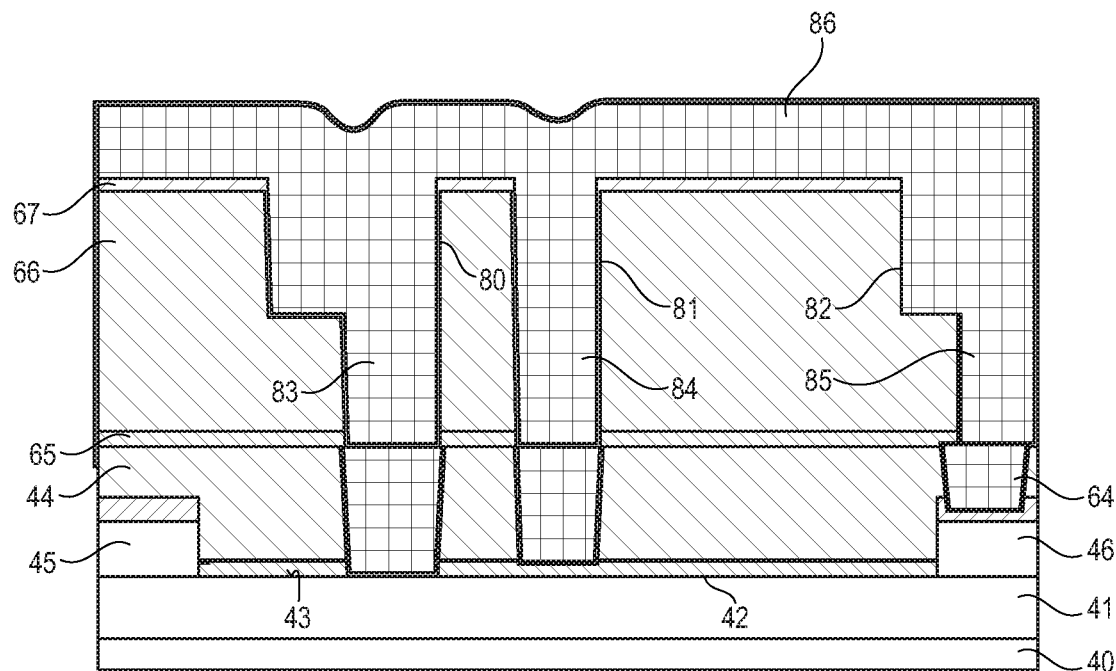

Referring to FIG. 2I, the trenches 80, 81, 82 and vias 83, 84, 85 extending from the base of the trenches 80, 81, 82 are then filled with conductive material 86. The conductive material 86 may include one or more layers and may include a barrier layer which lines the sidewalls of the respective trench and is positioned on the third passivation layer 65, fourth passivation layer 66 and on the remainder of the second insulating layer 67 positioned on the upper surface of the fourth passivation layer 66.

The conductive layer 86 of the redistribution structure that vertically connects to the conductive vias 62, 63, 64 and that extends perpendicularly to the conductive vias 62, 63, 63 in lateral or horizontal directions may be formed of the same material as the first conductive layer 60 and comprise one or more of tungsten, copper, titanium nitride, tungsten nitride, tantalum nitride or aluminium.

Figure 2J:
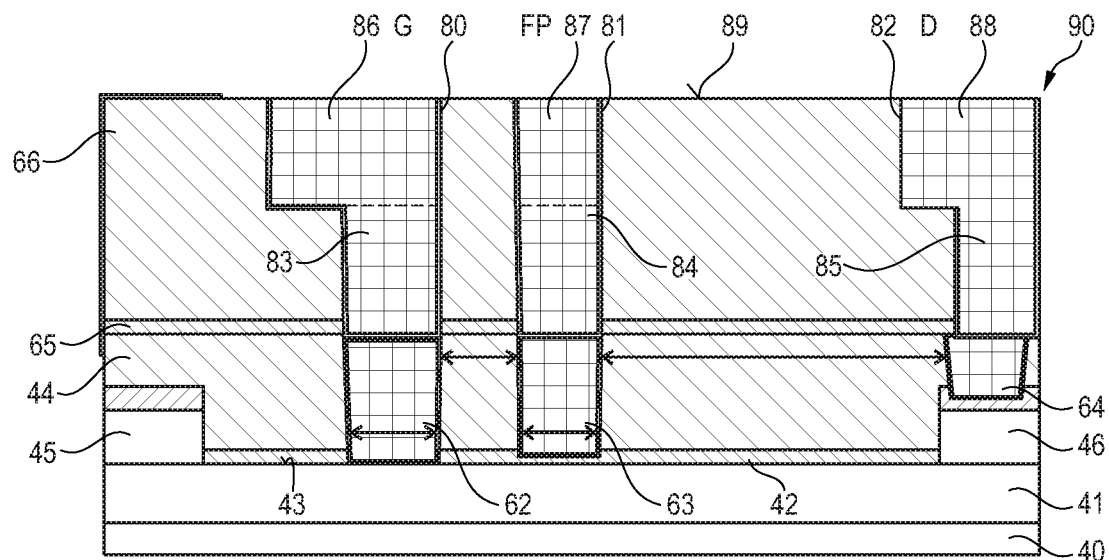

Referring to FIG. 2J, a planarisation process may then be carried out. The second insulating layer 67 may be used as a stop layer so that a planarised surface 89 is formed including material of the fourth passivation layer 66 and the conductive material positioned in the trenches 80, 81, 82.

A conductive redistribution structure 90 is formed which has horizontal portions 86, 87, 88 formed by the upper portions of the trenches 80, 81, 82 and vertical conductive vias 83, 84, 85 formed by the lower portions. The horizontal conductive portions 86, 87, 88 and the vertical conductive vias 83, 84, 85 are formed using a single deposition process which may be referred to as a dual damascene process.

The redistribution structure for the field plate includes different layers which include the conductive via 63 formed from the material of the first conductive layer 60 and the via 84 formed from the conductive layer 86. In some embodiments, the conductive materials 60 and 86 may be different. In some embodiments, the lower layer of the redistribution structure, for example, the conductive material 60 comprises a material having a higher work function that the upper layer or layers, for example conductive material 86, comprises a material with a smaller electrical resistance. This arrangement may be used to optimise the properties of the redistribution structure in each layer separately.

Using the Cartesian coordinate system, FIGS. 3A to 3G each illustrate a top view in an X-Y plane and a cross-sectional view in an X-Z plane of a conductive redistribution structure. Lateral directions are depicted in the X-Y plane and vertical directions in the Z direction of the Cartesian coordinate system.

Figure 3A:
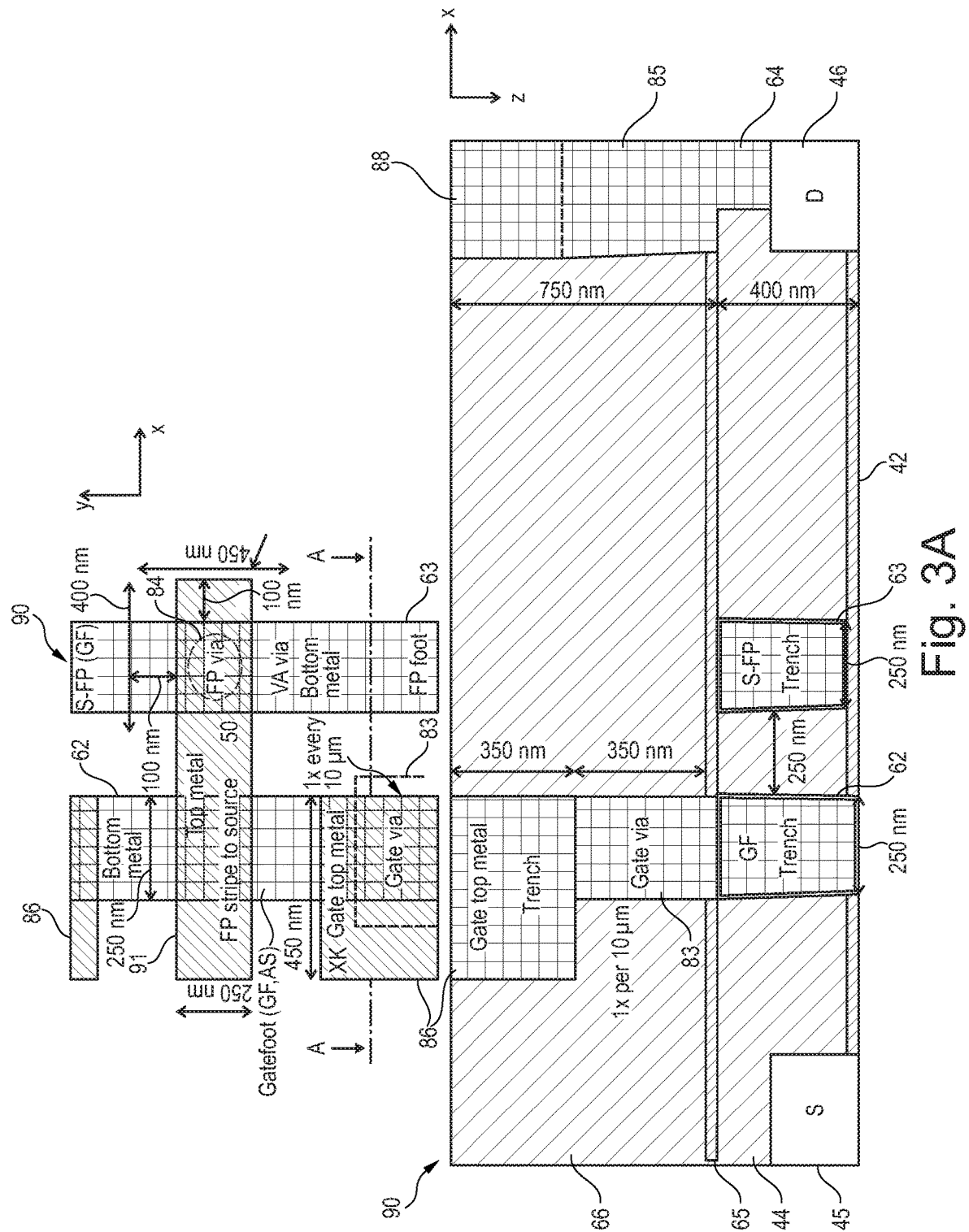
FIGS. 3A to 3G illustrate respective plan views and cross-sectional views of Group III nitride-based transistor devices according to embodiments.

FIG. 3A illustrates a top view and a cross-sectional view along the line A-A of a metallization structure 90. The metallization structure 90 may be fabricated using the methods described with reference to FIGS. 2A through 2J. As can be seen in the top view, the base of the gate 62 and the field plate 63 each have an elongate strip-like structure which extends in a longitudinal direction which is indicated in the drawings the Y direction.

The gate 62 has a conductive redistribution structure formed by a plurality of upper portions 86 of the trench 80 that extend horizontally or transversely in the X direction and a plurality of gate vias 83 that are spaced at intervals along the gate 62 in the Y direction and electrically couple the gate 62 to the upper portion 86. One gate via 83 is positioned under and electrically connected to one upper portion 86.

As can also be seen in the top view of FIG. 3A, the metallization structure 90 includes a transverse metal strip 91 which extends from the conductive via 87 coupled to the field plate 67 over the lower portion of the gate 62 to the source in order to electrically couple the field plate 63 to source potential. The transverse portions 91 coupled to the field plate 63 and the transverse portions 86 coupled to the gate 62 extend parallel to one another in the X direction and are arranged alternately and spaced apart from one another in the Y direction. A portion of the fourth passivation layer 66 is positioned between the metal strip 91 and the gate 62 in the plane A-A. Along the line A-A, there is no conductive connection between the elongate field plate 63 and the conductive strip 91.

The metallization structure 90 includes the lateral gate redistribution structure formed by the transverse portions 86 and a lateral field plate redistribution structure formed by the transvers portions 91 that are arranged in a plane above the plane of the gate electrode 62 and the field plate 63. The lateral gate redistribution structure and the lateral field plate redistribution structure are positioned at least partially above the active region of the Group III nitride-based transistor device since they are arranged laterally between the source electrode 45 and drain electrode 46.

The gate electrode 62 is electrically coupled to the lateral gate redistribution structure 86 by one or more gate conductive vias 83 that are positioned laterally between the source electrode 45 and the drain electrode 46 in order to electrically connect the gate electrode 62 to the upper transverse portions 86. The one or more gate conductive vias 83 are arranged above the active region of the Group III nitride-based transistor device.

Similarly, the field plate 63 is electrically coupled to the lateral field plate redistribution structure 91 by one or more field plate conductive vias 84 that are positioned laterally between the source electrode 45 and the drain electrode 46 in order to electrically connect field plate 63 to the lateral field plate redistribution structure 91. The one or more field plate conductive vias 84 are arranged above the active region of the Group III nitride-based transistor device.

Figure 3B:
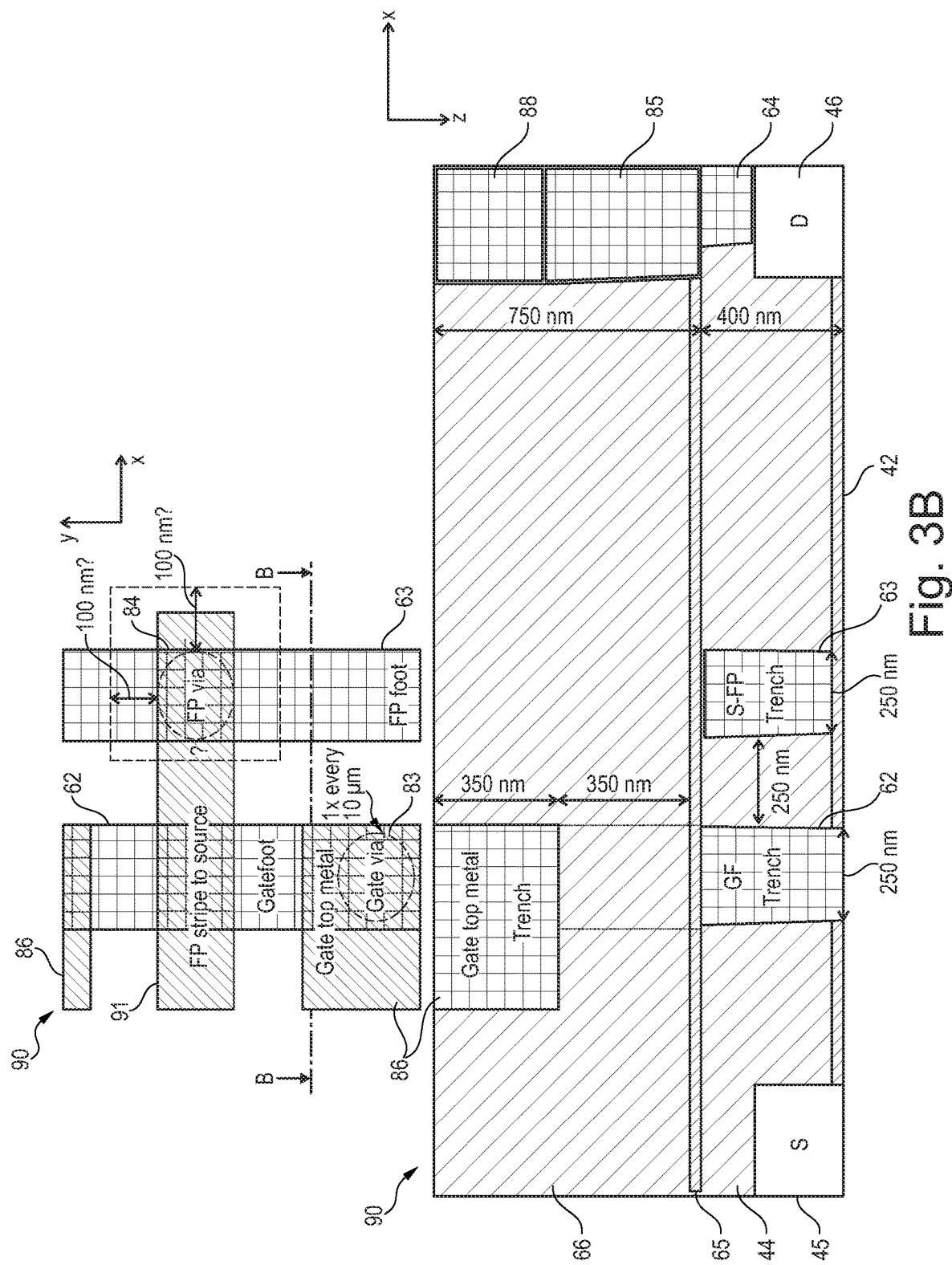

FIG. 3B illustrates a further top view of the metallization structure 90 and a cross-sectional view along the line B-B which lies outside of the lateral extent of the gate via 83. In the plane B-B, the horizontal or transverse portion 86 of the gate redistribution structure that is positioned above the gate 62 is vertically spaced apart from the gate 62 by a portion of the fourth passivation layer 66. Again, along the line B-B, there is no lateral connection between the field plate 63 and the upper surface 89 of the fourth passivation layer 66.

Figure 3C:
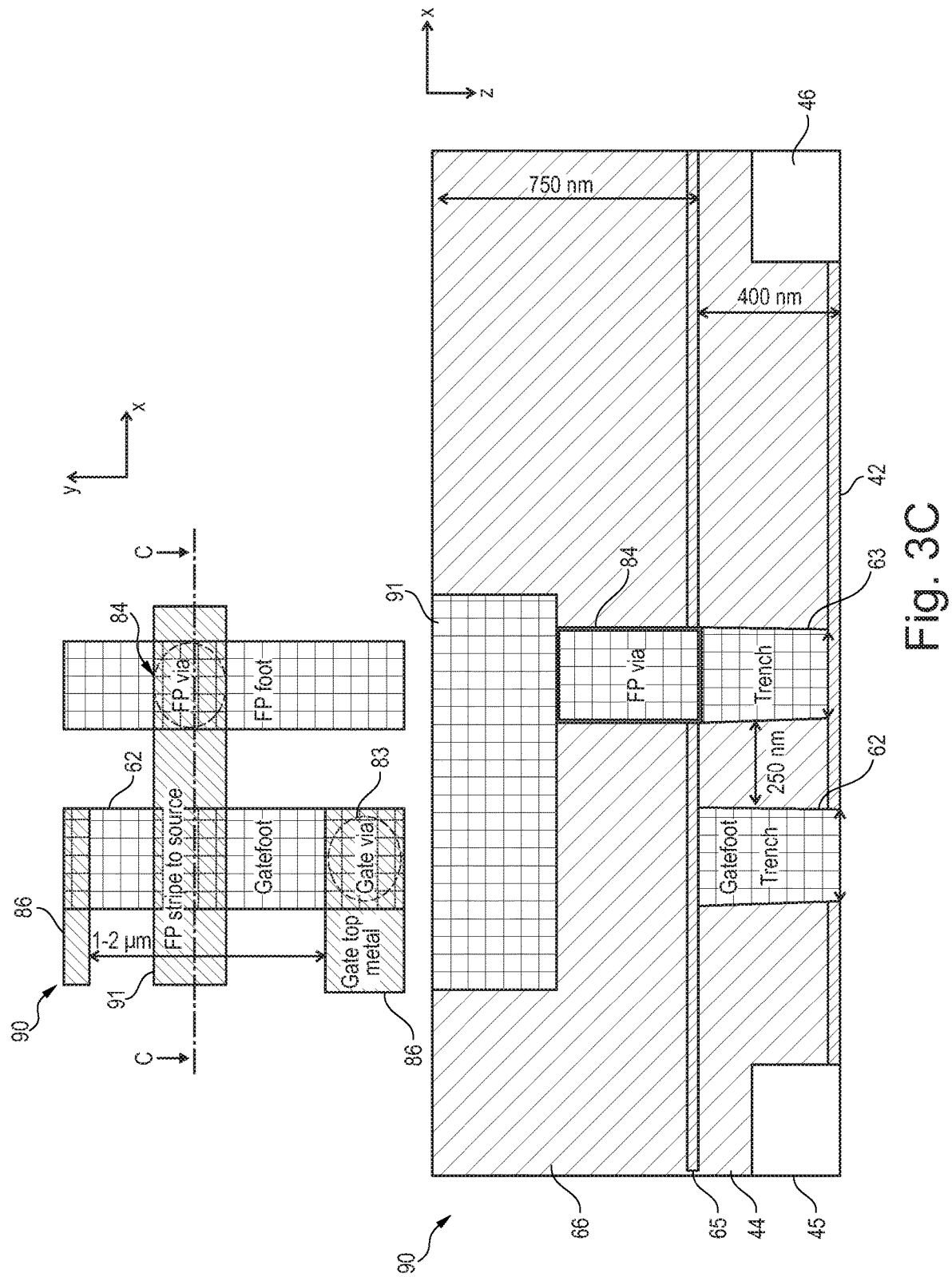

FIG. 3C illustrates a top view and a cross-sectional view along the line C-C of the redistribution structure 90 which illustrates the connection between the conductive strip 91, the conductive vias 84, 87 and the field plate 63. In the plane C-C, the elongate field plate 63 is electrically connected to the transverse strip 91 by one of the conductive vias 84, 87. As can also be seen in the cross-sectional view along line C-C, the conductive strip 91 is spaced apart from the underlying gate 62 by a portion of the fourth passivation layer 66.

Figure 3D:
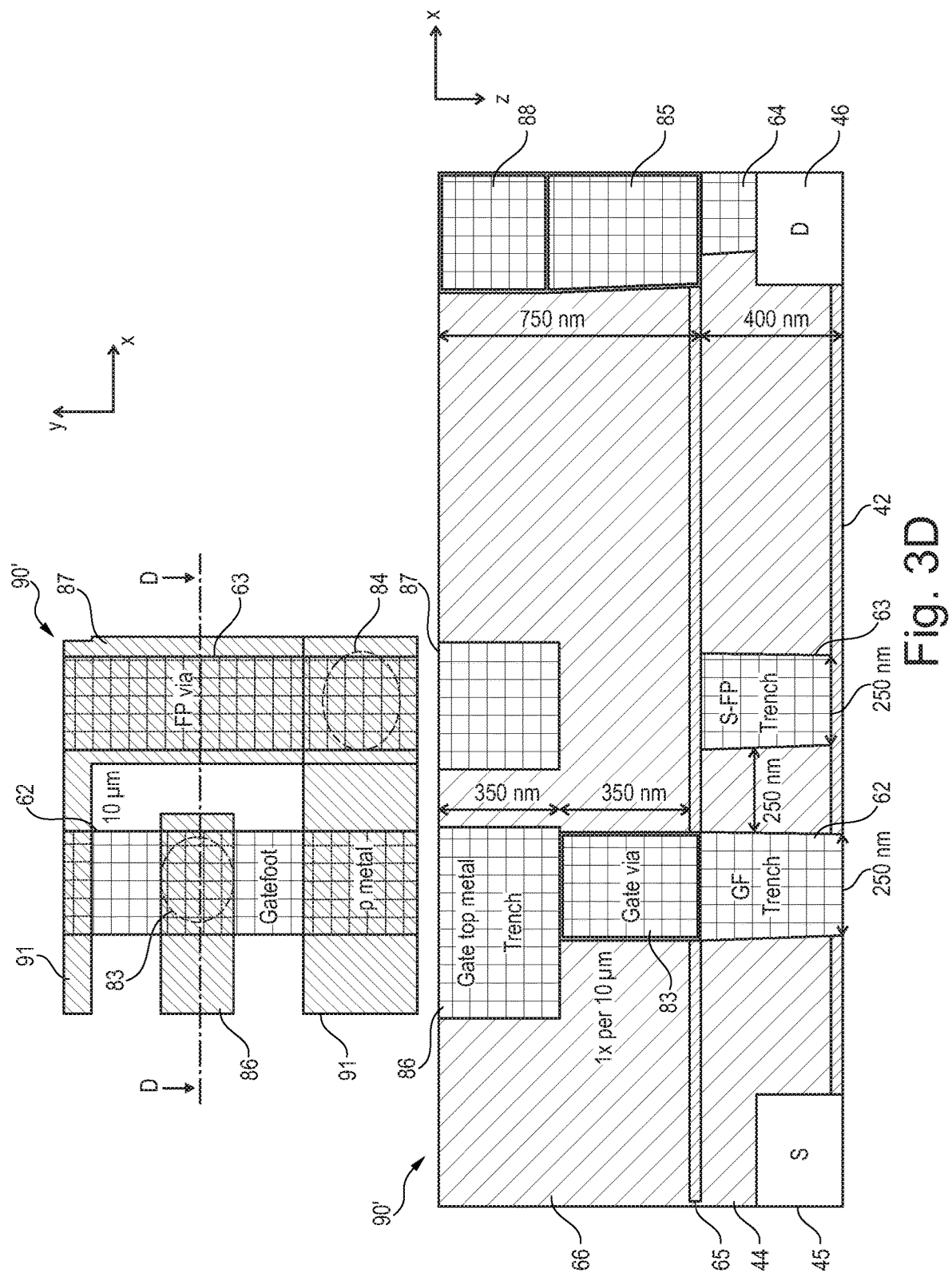

FIG. 3D illustrates a top view and a cross-sectional view of a redistribution structure 90' along the line D-D. The redistribution structure 90' differs from the redistribution structure 90 of FIGS. 3A to 3C in the redistribution structure for the field plate 63. In the redistribution structure 90', the upper portion 87 extends over the entire length of the field plate 63. In this embodiment, the upper field plate 87 has an elongate structure and extends substantially parallel to the lower field plate 63 in the Y direction. The upper field plate portion 87 is connected by a plurality of conductive field plate vias 84 positioned at spaced intervals in the Y direction that extend between the field plate 63 and upper field plate portion 87.

FIG. 3D illustrates a cross-sectional view along the line D-D and the conductive connection between the gate 62 and the upper lateral gate portion 86 at a longitudinal position which includes the gate via 83. In the plane D-D, the field plate 63 does not include a conductive field plate via 84 between the lower field plate 63 and the upper field plate 87. The lower field plate 63 and the upper field plate 87 are spaced apart vertically, i.e. in the Z direction, by a portion of the fourth passivation layer 66.

The transverse connections 86, 87 coupled to the gate 62 and field plate 63, respectively, are arranged alternately in the Y direction. The vias 62,83 for the gate and the vias 63, 84 for the field plate are also arranged alternately in the Y direction.

FIG. 3D illustrates a view of the redistribution structure 90' in which the upper field plate 87 has a longitudinal portion which is laterally wider in the X and Y directions than the field plate 63 positioned at the lower surface of the metallization structure 90 on the first passivation layer 42. This form of the upper field plate 87 provides a shielding structure. The redistribution structure for the field plate 63 includes a plurality of transverse portions 87 which extend above the gate 61 positioned in the first layer of the metallization structure 90. Transverse sections 86 of the gate redistribution structure are positioned between transverse portions of the field plate redistribution structure in the Y direction. The transverse portions 86 of the gate redistribution structure are electrically connected to the underlying gate trench 61 by the gate via 83 as can be seen in the cross-sectional view along the line D-D in FIG. 3D.

Figure 3E:
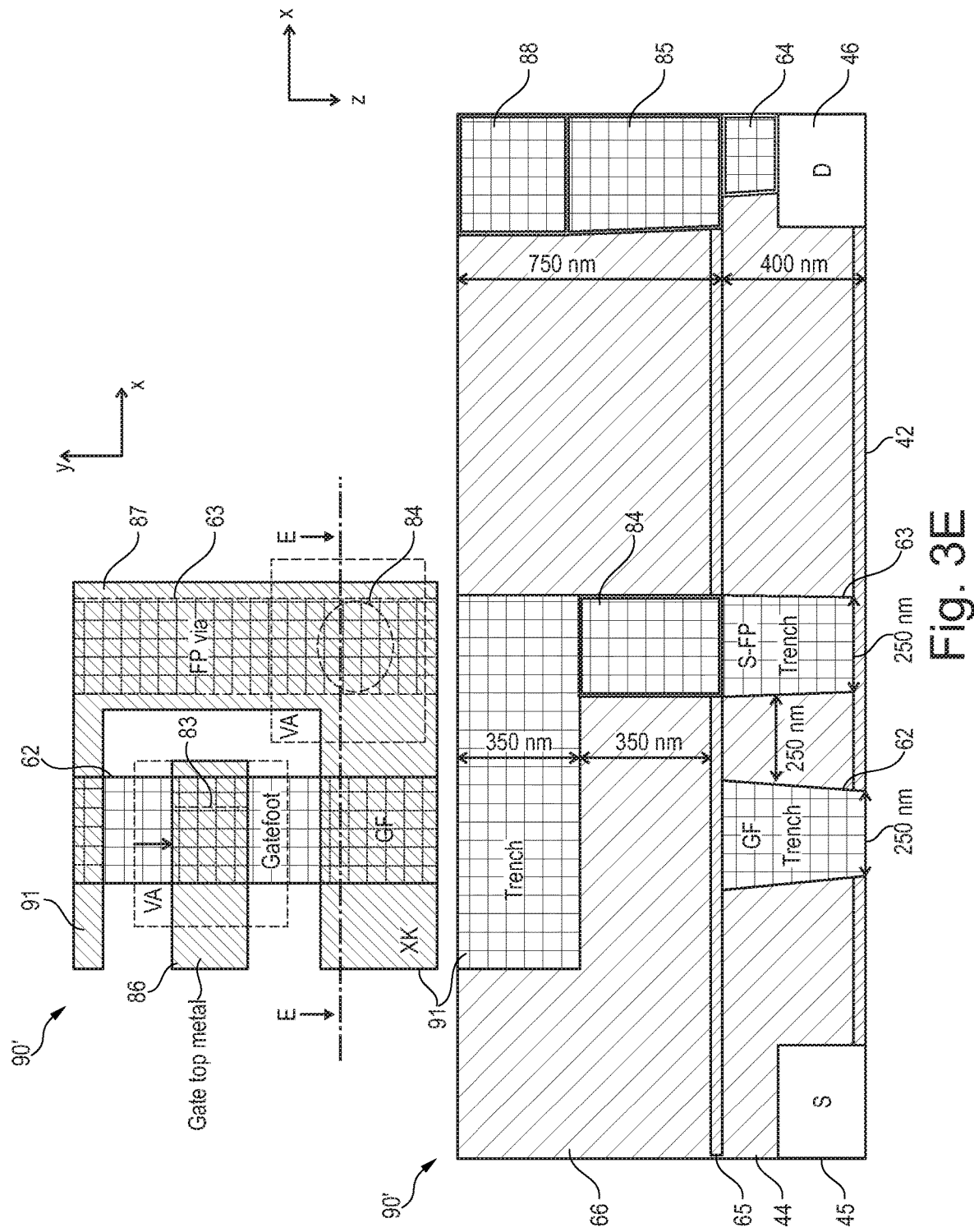

FIG. 3E illustrates a cross-sectional view of the redistribution structure 90' along the line E-E illustrates a cross-sectional view of the transverse field plate connection 87. The transverse field plate connection 87 extends over and above the gate 61 and is electrically insulated from the gate 61 by a vertically intervening portion of the third and fourth passivation layers 65, 66. In this position, the electrical connection between the transverse portion 87 and the field plate 63 by means of the field plate via 84 can be seen.

Figure 3F:
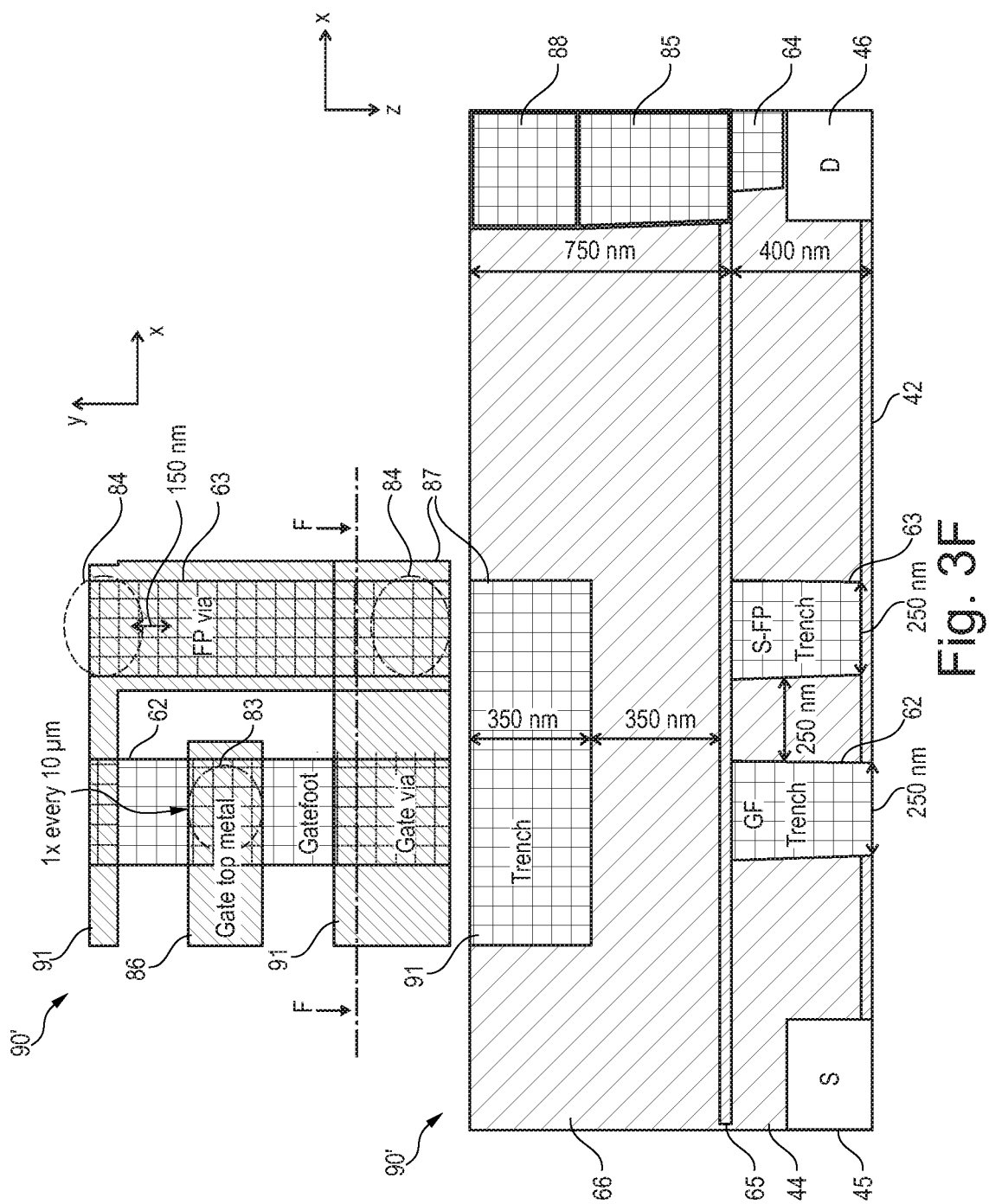

FIG. 3F illustrates a cross-sectional view of the redistribution structure 90' along the line F-F. The line F-F is positioned at a position in the longitudinal or Y direction of the gate 61 and field plate 63 in which no vias between the gate 62 and the field plate 63 and the upper surface 89 of the fourth passivation layer are positioned. This illustrates that the transverse portions 87 of the field plate 63 are laterally wider than the conductive vias 84, 87 and field plate 63. The laterally wider transverse portions 87 provide a shielding structure for the field plate 63.

The conductive vias 87 electrically connecting the field plate 63 to the overlying structure are spaced at intervals in the longitudinal direction of field plate 63. The conductive vias 87 electrically connecting the field plate 63 to the overlying structure are spaced at intervals in the longitudinal direction of field plate 63. The gate vias 83 are positioned in the longitudinal direction between the field plate vias 84. Therefore, alternate transverse portions 86, 87 are connected to the field plate and to gate can be seen in the top view of FIG. 3A.

Figure 3G:
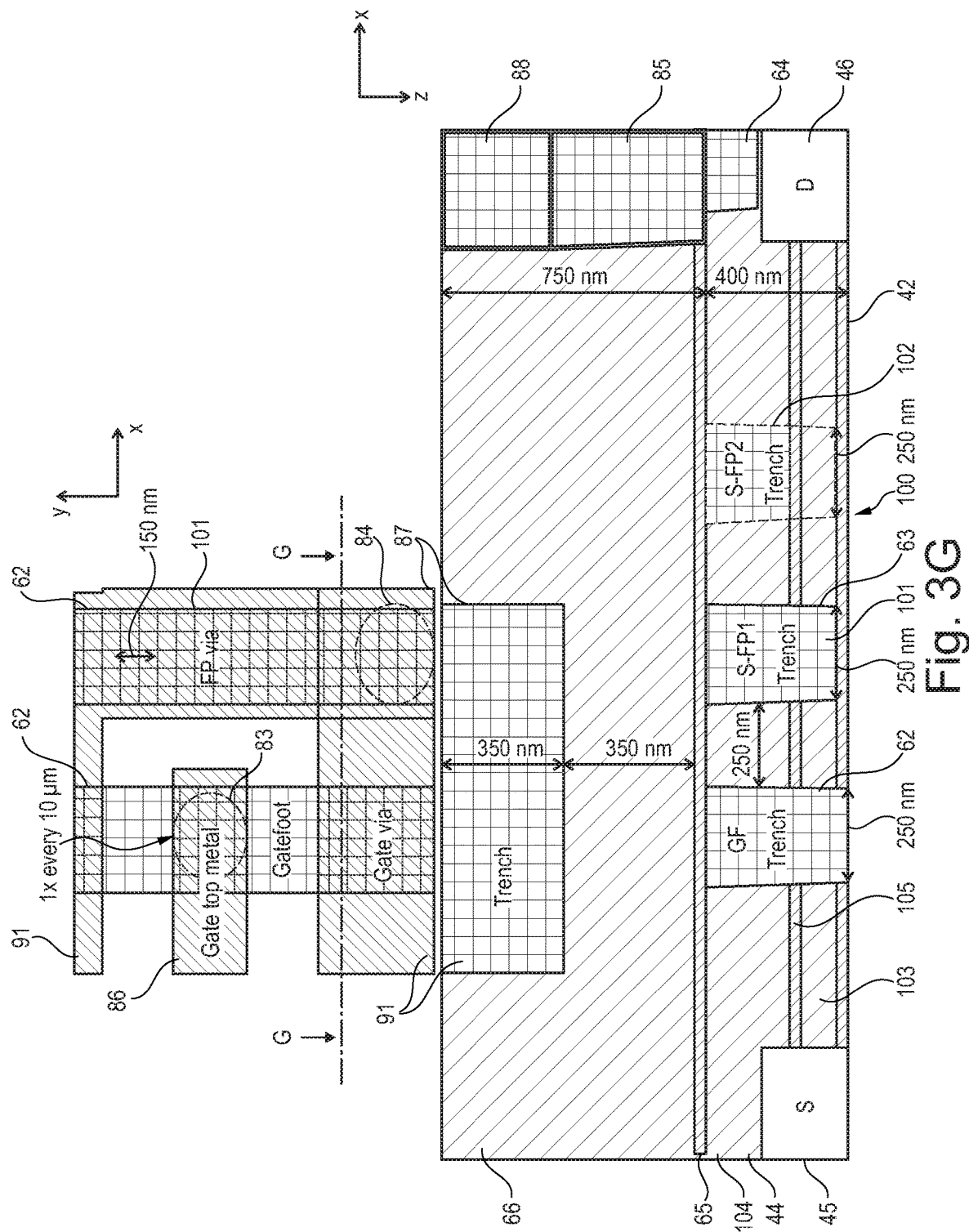

FIG. 3G illustrates a top view and a cross-sectional view along the line G-G of a further embodiment in which the field plate 63 has a split field plate structure 100 such that two field plates 101, 102 are positioned between the gate 62 and the drain 46. The two field plates 101, 102 are spaced apart from one another by portions of the passivation layer 44. In the embodiment illustrated in FIG. 3G, the first field plate structure 101 is positioned on the first passivation layer 42 and extends to the third passivation layer 65.

In this embodiment, the second passivation layer 44 is divided into two sublayers 103, 104 comprising an oxide material and a further fifth passivation layer 105, which comprises nitride, is positioned between the two sublayers 103, 104. The second field plate 102 is positioned on the fifth passivation layer 105 and extends vertically to the third passivation layer 65. The first field plate 101 that is portioned adjacent the gate 62 extends vertically through the lower sublayer 103, the fifth passivation layer 105 and the upper sublayer 104 to the third passivation layer 65.

The lower sublayer 103 and the fifth passivation layer 105 may have a thickness such that the conductive surface 21 of the source and drain contact 45, 46 is positioned within the second sublayer 104 of the second passivation layer 44.

In the embodiments illustrated in FIGS. 3D to 3F, the redistribution structure 90' for the field plate 63 includes a shielding effect provided by the upper conductive layer 87, since the upper conductive layer 87 has lateral dimensions which are greater than the lateral dimensions of the field plate 63 of the lower metallization layer that is positioned on the Group III nitride body 41.

FIGS. 4A-4C and 5A-5C illustrate respective plan views in the X-Y plane of metallization structures according to various embodiments which can be used for a transistor device, such as the transistor device illustrated in FIGS. 1 to 3G.

In FIGS. 4A through 4C, the transistor device includes a single field plate 63 positioned between the gate 62 and drain 46, and in FIGS. 5A through 5C the transistor device includes a split field plate 100 positioned between the gate 62 and drain 46. The ohmic drain contact and its conductive redistribution structure is not seen in FIGS. 4A-4C and 5A-5C.

FIG. 4A illustrates a top view of a portion of a metallization structure 110 including a lower conductive layer 111 and an upper conductive layer 112 which is vertically spaced apart from the lower conductive layer 111 by one or more passivation layers that are not depicted in the drawing.

The lower conductive layer 111 includes the ohmic source contact 45, the gate 62 and the field plate 63 which each have an elongate structure with a long direction extending in the longitudinal Y direction substantially parallel to one another. The upper conductive layer 112 provides a lateral redistribution structure for the gate 62 and a lateral redistribution structure for the field plate 63.

The upper conductive layer 112 includes a U-shaped portion which has a longitudinal portion 113 extending in the Y direction over the entire length of the field plate 63 and transverse portions 114 which extend in the X direction and substantially perpendicularly to the longitudinal portion 113. The transverse portions 114 are spaced apart from one another in the Y direction. Each transverse portion 114 extends from above the field plate 63 over the gate 62 to above at least region of the source contact 45. Each transverse portion 114 is electrically coupled to the underlying source contact 45 by an elongate conductive via 115 which extends vertically through the passivation layers to the underlying source contact 45. The transverse portions 114 and longitudinal portion 113 are electrically coupled to the field plate 63 by one or more conductive vias 116 extending between the longitudinal portion 113 and the field plate 63. In this embodiment, a single elongate via 116 is provided that extends vertically between the field plate 63 of the lower conductive layer 111 and the longitudinal portion 113 of the upper conductive layer 112 over substantially the entire length of the field plate 63 in the Y-direction, e.g. at least over at least 90% of the entire length of the field plate 63 in the Y-direction.

The gate 62 is electrically connected to a transverse conductive portion 117 of the upper conductive layer 112 which extends in the X direction from a position above the gate 62 to a position above or laterally adjacent the source contact 45. The transverse portion 117 coupled to the gate 62 is laterally spaced apart from the transverse portions 114 and longitudinal portion 113 of the upper conductive layer 112. The transverse portion 117 is electrically coupled to the underlying gate 62 by a via 118. No further conductive structure need be provided for the source contact 45 since the source contact 45 is coupled to the field plate 63 by way of the vias 115, 116 and transverse portions 114 of the upper conductive layer 112. This arrangement may be considered to be a fully shielded structure. In this fully shielded structure, the extent of the transverse portions 114 in the Y-direction may be at least 50% of the length of the field plate 63 in the Y-direction, such as at least 80% thereof. This fully shielded structure allows for a particularly low Cgd.

FIG. 4B illustrates a metallization structure 110 that is similar to that in FIG. 4A. It differs in that each of the transverse portions 114 of the upper conductive layer 112 has a smaller extent in the longitudinal Y direction, i.e. less than 50% of the length of the field plate 63 in the Y-direction, such as less than or equal to 20% thereof. The gap between each of the transverse portions 114 and the transverse portion 117 coupled to the gate 62 is larger than in the embodiment illustrated in FIG. 4A. The length of the vias 115 extending between the source contact 45 and the respective transverse portion 114 is also smaller due to the reduced width of the transverse portion 114 in the Y direction. This arrangement may be considered to be a semi shielded structure and allows for a lower Cgs than the fully shielded structure and may still have a lower Cgd than the non-shielded structure described below.

FIG. 4C illustrates an embodiment in which the upper conductive layer 112 includes only transverse portions 114 extending between the vias 115, 116 which are electrically coupled to the source 45 and field plate 63 respectively. The two transverse portions 114 are spaced apart from one another and not coupled to one another in the upper conductive layer by a longitudinal portion. In this embodiment, two vias 116 are used to couple the elongate field plate 63 to the transverse portions 114. This configuration may be referred to as a non-shielded structure which allows for a particularly low Cgs.

FIGS. 5A through 5C illustrate respective plan views of metallization structures 120 for embodiments including a split field plate 100, in which two field plates 101, 102 that are positioned between the gate 62 and drain 46 and that extend substantially parallel to one another. The lower conductive layer 111 includes the source contact 45, gate 62 and the first and second field plates 101, 102, the second field plate 102 being positioned between the first field plate 101 and the drain 46.

In FIG. 5A, the longitudinal portion 113 of the upper conductive layer 112 extends in the longitudinal direction continuously over the two field plates 101, 102. The transverse portions 114 are electrically connected to the two field plates 101, 102 by conductive vias 116, 116'.

Similar to the metallization structure 110 illustrated in FIG. 4A, the transverse portions 114 extend from above the two field plates 101, 102 over the gate 62 to above at least region of the source contact 45. Each transverse portion 114 is electrically coupled to the underlying source contact 45 by a conductive via 115 which extend through the passivation layers and to each of the field plates 101, 102 by a respective conductive via 116, 116'.

The gate 62 is electrically connected to a transverse conductive portion 117 of the upper conductive layer 112 which extends in the X direction from above the gate 62 over the source contact 45 and which is laterally spaced apart from the transverse portions 114 and longitudinal portion 113 of the upper conductive layer 112. The transverse portion 117 is electrically coupled to the underlying gate 62 by a via 118. No further conductive structure need be provided for the source contact 45 since the source contact 45 is coupled to the field plates 101, 102 by way of the vias 115, 116, 116' and transverse portions 114 of the upper conductive layer 112. This arrangement may be considered to be a fully shielded structure.

In the embodiment illustrated in FIG. 5B, the upper conductive layer 112 includes illustrates a metallization structure 120 that is similar to that of FIG. 5A, but differs in that each of the transverse portions 114 of the upper conductive layer 112 has a smaller extent in the longitudinal Y direction. The gap between each transverse portion 114 that is coupled to the field plates 101, 102 and the transverse portion 117 that is coupled to the gate 62 is larger than in the embodiment illustrated in FIG. 4A. The length of the vias 115 extending between the source contact 45 and the respective transverse portion 114 is smaller due to the reduced width of the transverse portion 114 in the Y direction. Each transverse portion 114 extends over and is connected to the underlying two field plates 101, 102 by a single conductive via 116, 116' arranged on the field plates 101, 102, respectively.

In the embodiment illustrated in FIG. 5C, the upper conductive layer 112 includes only transverse portions 114 extending between the vias 115, 116, 116' which are electrically coupled to the source 45 and the two field plates 101, 102 respectively. The two transverse portions 114 are spaced apart from one another and not coupled to one another in the upper conductive layer 112 by a longitudinal portion. In this embodiment, a first via 116 is used to couple the first elongate field plate 101 and a second via 116' is used to couple the second elongate field plate 102 to a first one of the transverse portions 114 and a first via 116 is used to couple the first elongate field plate 101 and a second via 116' is used to couple the second elongate field plate 102 to a second one of the transverse portions 114.

Methods for fabricating an ohmic contact for Group III nitride-based transistor devices, for example HEMTs, are disclosed that enable the fabrication of a device with a short gate length Lg, for example Lg≤250 nm, and an optimized feed-back capacitance Cgd. Such short gate lengths are useful for radio-frequency application transistors requiring a high transition frequency fT in the range 50 GHz to 150 GHz.

The formation of this planarised surface after fabrication of the source and drain enables the subsequent layers built up upon it to be planar. This enables the gate 14 and field plate 17 to be formed using photolithographic techniques after the fabrication of the ohmic contacts 45, 46, which typically involves higher processing temperatures, whereby the photoresist mask and deposition processes for fabricating at least a base portion of the gate 62 and field plate 63 can be carried out on this planarised surface. This method enables the photoresist layer for the gate 62 and field plate 63 to be more accurately structured, since it is formed on a planar surface. As a result of the more accurate structuring of the photoresist layer, the dimensions and position of the gate 62 and field plate 63 can be more accurately controlled. This also enables the distance $d_{SG}$ between the ohmic source contact 45 and the gate 62, as measured at the base of the ohmic contact 45 and gate 62, to be reduced and to be reliably produced at this reduced length. The gate to source distance $d_{SG}$ may be less than 0.5 µm, for example 250 nm or less in order to lower $R_{DSON}$ and enhance device performance. The more accurate structuring of the photoresist layer, the position of the field plate 63 with respect to the gate 62, $d_{GFP}$, can also be more reliably controlled and may also be less than 0.5 µm, for example 250 nm or less.

Additionally, the critical dimension control of the gate process is improved to enhance manufacturability and device performance. The gate length $L_G$ and/or the length of the field plate $L_{FP}$ may also be less than 0.5 µm, for example 250 nm or less. This high precision patterning of the gate electrode is enabled as the photoresist processes of the gate and field plate are not affected by topography steps created by the Ohmic metal contacts 45, 46 due to the formation of the planarized surface. Such topography steps would impair the local uniformity of the involved anti-reflection-coating and resist coating processes and would degrade the depth-of-focus of the lithographic exposure process. In effect the control of small dimension lithographic structures would be severely limited.

The following numbered examples demonstrate one or more aspects of the disclosure.

Example 1. A method of fabricating a Group III nitride-based transistor, comprising: providing a substrate comprising a Group III nitride-based layer, a first passivation layer on the first major surface of the Group III nitride-based layer and a second passivation layer arranged on the first passivation layer, the second passivation layer having a different composition from the first passivation layer; forming a first mask layer on the second passivation layer, the first mask layer comprising a first insulating layer arranged on the second passivation layer and a first resist layer on the first insulating layer; forming a first opening for a gate electrode in the first mask layer, the first opening extending through the first photoresist layer and through the first insulating layer; forming a second opening for a field plate in the first mask layer, the second opening extending through the first photoresist layer and through the first insulating layer; removing the second passivation layer exposed by the first opening and forming a first via for the gate electrode, the first via having a base formed by the first passivation layer; removing the second passivation layer exposed by the second opening and forming a second via for a field plate, the second via having a base formed by the first passivation layer; removing the first photoresist layer; applying a second photoresist layer onto the first insulating layer that covers the second opening for the field plate and leaves the first opening for the gate electrode and a region of the first insulating layer adjacent the first opening uncovered; removing the first passivation layer exposed by first via and increasing the depth of the first via such that the first via has a base formed by the Group III nitride multi-layer structure; removing the second resist layer; depositing an electrically conductive layer into the first via and the second via.

Example 2. A method according to Example 1, wherein the second resist layer leaves a portion of the first insulating layer that is arranged adjacent the first via exposed.

Example 3. A method according to Examples 1 or Example 2, wherein the first insulating layer and the first photoresist are patterned using DUV technology.

Example 4. A method according to one of examples 1 to 3, wherein the base of the first via has a width of between 50 nm and 400 nm and/or a minimum distance between the base of the first via and the second via is between 50 nm and 400 nm.

Example 5. A method according to one of examples 1 to 4, wherein the first passivation layer comprises silicon nitride, the second passivation layer comprises silicon oxide and the first insulating layer comprises titanium nitride.

Example 6. A method according to one of examples 1 to 5, wherein the substrate further comprises a first ohmic contact and a second ohmic contact on the first major surface of the Group III nitride-based layer, the first passivation layer is located on the first major surface of the Group III nitride-based layer and extends between the first ohmic contact and the second ohmic contact and the second passivation layer is arranged on the first passivation layer and on the first ohmic contact and on the second ohmic contact.

Example 7. A method according to example 6, wherein the substrate comprises the first passivation layer arranged on the first major surface and the method further comprises:

forming the first ohmic contact and the second ohmic contact on the first major surface of the Group III nitride-based layer such that the first ohmic contact and the second ohmic contact extend at least partially through the first passivation layer, covering the first ohmic contact and the second ohmic contact with a first sublayer of passivation material, planarising to form an intermediate planarized surface comprising a surface of the first ohmic contact, a surface of the second ohmic contact and the first sublayer, forming a second sublayer of passivation material on the planarized surface and arranged on the first ohmic contact and the second ohmic contact, the first and second sublayers forming the second passivation layer.

Example 8. A method according to example 6 or example 7, further comprising: forming a third opening in the first mask layer, the third opening extending through the first photoresist layer and the first insulating layer and being positioned above the second ohmic contact; removing the second passivation layer exposed in the third opening and forming a third via having a base exposing a portion of the second ohmic contact; covering the third via with the second resist layer, and, after removal of the second resist layer further depositing the electrically conductive material into the third via, planarising to form a planarised surface comprising isolated areas of electrically conductive material positioned in the first, second and third vias, each isolated area of electrically conductive material being surrounded by the second passivation layer.

Example 9. A method according to one of examples 1 to 8, further comprising: forming a second insulation layer on the second passivation layer and on the isolated areas of electrically conductive material; forming a third insulating layer on the second insulation layer, the second and third insulation layers having differing compositions; structuring the third insulation layer to form a first trench positioned above the first via, the first trench having a base spaced apart from the first via by a portion of the third insulating layer and the second insulating layer, the first trench being laterally wider than the first via; forming a fourth via in the base of the first trench that exposes the electrically conductive material in the first via by removing the third insulation layer and the second insulation layer, the fourth via being laterally smaller than the first trench; forming a second electrically conductive material layer in the fourth via and in the first trench.

Example 10. A method according to example 9, further comprising: structuring the third insulation layer to form a second trench above the second via and a third trench above the third via, the second trench having a base spaced apart from the second via by a portion of the third insulating layer and the second insulating layer, the second trench being laterally wider than the second via, the third trench having a base spaced apart from the third via by a portion of the third insulating layer and the second insulating layer, the third trench being laterally wider than the third via; forming a fifth via in the second trench that exposes the electrically conductive material in the second via by removing the third insulation layer in the base of the second trench; forming a sixth via in the third trench that exposes the electrically conductive material in the third via by removing the third insulation layer in the base of the third trench; depositing the second electrically conductive material layer into the second and third trenches and into the fifth and sixth vias.

Example 11. A Group III nitride-based transistor device, comprising: a source electrode, a drain electrode and a gate electrode positioned on a first major surface of a Group III nitride-based layer, wherein the gate electrode is laterally arranged between the source electrode and the drain electrode, and a field plate, the field plate being laterally arranged between and spaced apart from the gate electrode and the drain electrode, wherein a base of the gate electrode and a base of the field plate each have a width of between 50 nm and 400 nm and the distance between the gate electrode and the field plate at the closest point is between 50 nm and 400 nm.

Example 12. A Group III nitride-based transistor device, comprising: a first passivation layer arranged on a first major surface of a Group III nitride-based layer; a second passivation layer arranged on the first passivation layer; a source ohmic contact, a drain ohmic contact and a gate positioned on the first major surface of a Group III nitride-based layer, wherein the gate is laterally arranged between the source ohmic contact and the drain ohmic contact and comprises a gate via extending to an upper surface of the second passivation layer; a field plate, the field plate being laterally arranged between and spaced apart from the gate and the drain ohmic contact and extending to an upper surface of the second passivation layer; a first via extending from the source ohmic contact to an upper surface of the second passivation layer; a second via extending from the drain ohmic contact to the upper surface of the second passivation layer;

wherein the second passivation layer covers peripheral regions of the source ohmic contact and the drain ohmic contact, a first substantially planar insulating layer arranged on the upper surface of the second passivation layer and on peripheral regions of the gate electrode, the field plate, the first via and the second via.

Example 13. A Group III nitride-based transistor device, according to example 12, wherein the source ohmic contact comprises: a base portion having a conductive surface, the conductive surface comprising a peripheral portion and a central portion, the peripheral portion and the central portion being substantially coplanar and being of differing composition; wherein the first via is positioned on the central portion of the conductive surface, and/or the drain ohmic contact comprises: a base portion having a conductive surface, the conductive surface comprising a peripheral portion and a central portion, the peripheral portion and the central portion being substantially coplanar and being of differing composition; wherein the second via is positioned on the central portion of the conductive surface.

Example 14. A Group III nitride-based transistor device according to example 13, wherein the field plate extends substantially perpendicularly to the first major surface and is electrically coupled to the source electrode by a lateral field plate redistribution structure that extends over and is spaced apart from the gate electrode.

Example 15. A Group III nitride-based transistor device according to example 12, wherein the source electrode, the gate electrode, the drain electrode and the field plate each have an elongate form and extend on the first major surface in a longitudinal direction substantially parallel to one another, wherein the lateral field plate redistribution structure comprises a longitudinal section positioned above the field plate and extending substantially parallel to the longitudinal direction and a plurality of transverse sections spaced at intervals in the longitudinal direction, each transverse section extending over and being spaced apart from the gate electrode and being electrically coupled to the field plate by a field plate conductive via.

Example 16. A Group III nitride-based transistor device according to example 14, further comprising a lateral gate redistribution structure, the lateral gate redistribution structure comprising a plurality of transverse sections that extend substantially perpendicularly to the longitudinal direction, each transverse section being spaced apart from the gate electrode and electrically coupled to the gate electrode by a gate conductive via, the transverse section of the lateral gate redistribution structure being interleaved with the transverse sections of the lateral field plate redistribution structure.

Example 17. A Group III nitride-based transistor device according to one of examples 13 to 16, wherein the source electrode is electrically coupled to the lateral field plate redistribution structure.

Example 18. A Group III nitride-based transistor device according to example 17, further comprising a source redistribution structure extending in the longitudinal direction and arranged above and spaced apart from the source electrode, wherein the source electrode is electrically coupled by one or more source conductive vias to the source redistribution structure and the source redistribution structure is integral with the transverse sections of the field plate redistribution structure.

Example 19. A Group III nitride-based transistor device according to one of examples 15 to 18, wherein the longitudinal section of the lateral field plate redistribution structure is laterally wider than the field plate.

Example 20. A Group III nitride-based transistor device according to one of examples 13 to 19, wherein the field plate is split into two field plate sections that extend substantially parallel to one another and are laterally spaced apart from one another, the two field plate sections being laterally arranged between and spaced apart from the gate electrode and the drain electrode.

Example 21. A Group III nitride-based transistor device, comprising: a source electrode, a drain electrode and a gate electrode positioned on a first major surface of a Group III nitride-based layer, wherein the gate electrode is laterally arranged between the source electrode and the drain electrode; a passivation layer arranged on the first major surface; a field plate coupled to the source electrode, the field plate having a lower surface arranged on the passivation layer, the field plate being laterally arranged between and laterally spaced apart from the gate electrode and the drain electrode, wherein the source electrode, the gate electrode, the drain electrode and the field plate each have an elongate form and extend on the first major surface in a longitudinal direction substantially parallel to one another; a conductive redistribution structure arranged above the source electrode, the gate electrode, the drain electrode and the field plate and comprising a lateral gate redistribution structure and a lateral field plate redistribution structure that are substantially coplanar at a position laterally between the source electrode and the drain electrode.

Example 22. A Group III nitride-based transistor device according to example 21, wherein an upper surface of the field plate and an upper surface of the gate electrode are substantially coplanar.

Example 23. A Group III nitride-based transistor device according to example 21 or example 22, wherein the gate electrode is electrically coupled to the lateral gate redistribution structure by one or more gate conductive vias.

Example 24. A Group III nitride-based transistor device according to example 23, wherein the one or more gate conductive vias are positioned laterally between the source electrode and the drain electrode.

Example 25. A Group III nitride-based transistor device according to any one of examples to 21 to 24, wherein the field plate is electrically coupled to the lateral field plate redistribution structure by one or more field plate conductive vias.

Example 26. A Group III nitride-based transistor device according to example 25, wherein the one or more field plate conductive vias are positioned laterally between the source electrode and the drain electrode.

Example 27. A Group III nitride-based transistor device according to any one of examples 21 to 26, wherein an upper surface of the source electrode and an upper surface of the drain electrode are substantially coplanar and arranged at a distance above the first major surface that is less than the distance between the upper surface of the gate electrode and the first major surface.

Example 28. A Group III nitride-based transistor device according to one of examples 21 to 27, wherein the source electrode is electrically coupled to the lateral field plate redistribution structure by one or more source conductive vias.

Example 29. A Group III nitride-based transistor device according to one of examples 21 to 28, wherein the lateral field plate redistribution structure extends over and is spaced apart from the gate electrode.

Example 30. A Group III nitride-based transistor device according to one of examples 21 to 29, wherein the lateral field plate redistribution structure comprises a plurality of transverse sections spaced at intervals in the longitudinal direction, each transverse section extending over and being spaced apart from the gate electrode and being electrically coupled to the field plate by a field plate conductive via.

Example 31. A Group III nitride-based transistor device according to example 30, wherein the lateral field plate redistribution structure further comprises a longitudinal section positioned above the field plate and extending substantially parallel to the longitudinal direction and to the field plate, wherein the longitudinal section is connected to the transverse sections, and wherein the longitudinal section is electrically coupled to the field plate by a single elongated field plate conductive via.

Example 32. A Group III nitride-based transistor device according to example 30 or example 31, wherein the transverse sections together cover less than 50% or less than 20% of a length of the gate electrode.

Example 33. A Group III nitride-based transistor device according to example 32, wherein the transverse sections together cover at least 50% or at least 80% of a length of the gate electrode.

Example 34. A Group III nitride-based transistor device according to one of examples 27 to 33, wherein the transverse sections of the lateral field plate structure are arranged above and spaced apart from the source electrode and the source electrode is electrically coupled by one or more source conductive vias to the transverse sections of the field plate redistribution structure.

Example 35. A Group III nitride-based transistor device according to one of examples 21 to 34, wherein the lateral field plate redistribution structure further comprises a longitudinal section positioned above the field plate and extending substantially parallel to the longitudinal direction and to the field plate, wherein the longitudinal section is connected to the transverse sections.

Example 36. A Group III nitride-based transistor device according to example 35, wherein the longitudinal section of the lateral field plate redistribution structure is laterally wider than the conductive vias and the field plate.

Example 37. A Group III nitride-based transistor device according to one of examples 21 to 36, wherein the field plate is split into two field plate sections that extend substantially parallel to one another and are laterally spaced apart from one another, the two field plate sections being laterally arranged between and spaced apart from the gate electrode and the drain electrode.

Example 38. A Group III nitride-based transistor device according to one of examples 21 to 37, wherein the lateral gate redistribution structure comprises a plurality of transverse sections spaced at intervals in the longitudinal direction, each transverse section being spaced apart from the gate electrode and electrically coupled to the gate electrode by a conductive via.

Example 39. A Group III nitride-based transistor device according to example 38, wherein the transverse sections of the lateral gate redistribution structure are interleaved with the transverse sections of the lateral field plate redistribution structure.

Example 40. A Group III nitride-based transistor device according to one of examples 21 to 39, wherein an upper surface of the lateral gate redistribution structure is substantially coplanar with an upper surface of the lateral field plate redistribution structure.

Example 41. A Group III nitride-based transistor device according to one of examples 38 to 40, wherein the transverse sections of the lateral gate redistribution structure extend over and are spaced apart from the source electrode.

Example 42. A Group III nitride-based transistor device according to one of examples 38 to 41, wherein the lateral gate redistribution structure further comprises a longitudinal section that is positioned on an opposing side of the source electrode from the gate electrode and the transverse sections of the lateral gate redistribution structure are connected to the longitudinal section.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a Group III nitride-based transistor, the method comprising:
providing a substrate comprising a Group III nitride-based layer, a first passivation layer on a first major surface of the Group III nitride-based layer and a second passivation layer arranged on the first passivation layer, the second passivation layer having a different composition from the first passivation layer;
forming a first ohmic contact and a second ohmic contact on the first major surface of the Group III nitride-based layer such that the first ohmic contact and the second ohmic contact extend at least partially through the first passivation layer, wherein the first passivation layer extends between the first ohmic contact and the second ohmic contact, and wherein the second passivation layer is arranged on the first ohmic contact and on the second ohmic contact;

covering the first ohmic contact and the second ohmic contact with a first sublayer of passivation material;

planarising to form an intermediate planarized surface comprising a surface of the first ohmic contact, a surface of the second ohmic contact and the first sublayer; and forming a second sublayer of passivation material on the planarized surface and arranged on the first ohmic contact and the second ohmic contact, the first and second sublayers forming the second passivation layer;

forming a first mask layer on the second passivation layer, the first mask layer comprising a first insulating layer arranged on the second passivation layer and a first resist layer on the first insulating layer;

forming a first opening for a gate electrode in the first mask layer, the first opening extending through the first resist layer and through the first insulating layer;

forming a second opening for a field plate in the first mask layer, the second opening extending through the first resist layer and through the first insulating layer;

removing the second passivation layer exposed by the first opening and forming a first via for the gate electrode, the first via having a base formed by the first passivation layer;

removing the second passivation layer exposed by the second opening and forming a second via for a field plate, the second via having a base formed by the first passivation layer;

removing the first resist layer;

applying a second resist layer onto the first insulating layer that covers the second opening for the field plate and leaves the first opening for the gate electrode and a region of the first insulating layer adjacent the first opening uncovered;

removing the first passivation layer exposed by the first via and increasing the depth of the first via such that the first via has a base formed by the Group III nitride-based layer;

removing the second resist layer; and depositing an electrically conductive layer into the first via and the second via.

2. The method of claim 1, wherein the second resist layer leaves a portion of the first insulating layer that is arranged adjacent the first via exposed.

3. The method of claim 1, wherein the base of the first via has a width of between 50 nm and 400 nm and/or a minimum distance between the base of the first via and the second via is between 50 nm and 400 nm.

4. The method of claim 1, wherein the first passivation layer comprises silicon nitride, the second passivation layer comprises silicon oxide and the first insulating layer comprises titanium nitride.

5. The method of claim 1, further comprising:

forming a third opening in the first mask layer, the third opening extending through the first resist layer and the first insulating layer and being positioned above the second ohmic contact;

removing the second passivation layer exposed in the third opening and forming a third via having a base exposing a portion of the second ohmic contact;

covering the third via with the second resist layer;

after removal of the second resist layer, further depositing the electrically conductive material into the third via; and planarising to form a planarised surface comprising isolated areas of electrically conductive material positioned in the first, second and third vias, each isolated area of electrically conductive material being surrounded by the second passivation layer.

6. The method of claim 5, further comprising:

forming a second insulation layer on the second passivation layer and on the isolated areas of electrically conductive material;

forming a third insulating layer on the second insulation layer, the second and third insulation layers having differing compositions;

structuring the third insulation layer to form a first trench positioned above the first via, the first trench having a base spaced apart from the first via by a portion of the third insulating layer and the second insulating layer, the first trench being laterally wider than the first via;

forming a fourth via in the base of the first trench that exposes the electrically conductive material in the first via by removing the third insulation layer and the second insulation layer, the fourth via being laterally smaller than the first trench; and forming a second electrically conductive material layer in the fourth via and in the first trench.

7. The method of claim 6, further comprising:

structuring the third insulation layer to form a second trench above the second via and a third trench above the third via, the second trench having a base spaced apart from the second via by a portion of the third insulating layer and the second insulating layer, the second trench being laterally wider than the second via, the third trench having a base spaced apart from the third via by a portion of the third insulating layer and the second insulating layer, the third trench being laterally wider than the third via;

forming a fifth via in the second trench that exposes the electrically conductive material in the second via by removing the third insulation layer in the base of the second trench;

forming a sixth via in the third trench that exposes the electrically conductive material in the third via by removing the third insulation layer in the base of the third trench; and depositing the second electrically conductive material layer into the second and third trenches and into the fifth and sixth vias.

8. The method of claim 1, wherein the electrically conductive material is tungsten.

* * * * *